United States Patent [19]
Nakahata et al.

[11] Patent Number: 5,565,725
[45] Date of Patent: Oct. 15, 1996

[54] SURFACE ACOUSTIC WAVE DEVICE

[75] Inventors: Hideaki Nakahata; Kenjiro Higaki; Satoshi Fujii; Akihiro Hachigo; Shin-ichi Shikata, all of Itami, Japan

[73] Assignee: Sumitomo Electric Industries, Ltd., Japan

[21] Appl. No.: 429,401

[22] Filed: Apr. 26, 1995

[30] Foreign Application Priority Data

May 10, 1994 [JP] Japan ................................. 6-096534
Sep. 2, 1994 [JP] Japan ................................. 6-210113

[51] Int. Cl.$^6$ .................................................. H01L 41/08
[52] U.S. Cl. .................................. 310/313 A; 310/313 R
[58] Field of Search .......................... 310/313 A, 313 B, 310/313 R; 333/150–154, 193–196

[56] References Cited

U.S. PATENT DOCUMENTS

| | | | |
|---|---|---|---|
| 5,294,858 | 3/1994 | Nakahata et al. | 310/313 A |
| 5,329,208 | 7/1994 | Imai et al. | 310/313 R |
| 5,343,107 | 8/1994 | Shikata et al. | 310/313 A |
| 5,401,544 | 3/1995 | Nakahata et al. | 310/313 A X |
| 5,440,189 | 8/1995 | Nakahata et al. | 310/313 R |
| 5,446,329 | 8/1995 | Nakahata et al. | 310/313 A |

FOREIGN PATENT DOCUMENTS

| | | |
|---|---|---|
| 0534411 | 3/1993 | European Pat. Off. . |
| 1-62911 | 3/1989 | Japan . |

OTHER PUBLICATIONS

Y. Miura, et al., "Preparation of ZnO Films by an Activated Reactive Evaporation Method", published Apr., 1991, pp. 379–384.

Primary Examiner—Mark O. Budd
Attorney, Agent, or Firm—Pennie & Edmonds

[57] ABSTRACT

A SAW device which includes at least, diamond, an LiNbO$_3$ layer disposed on the diamond, and an IDT provided so as to contact the LiNbO$_3$ layer; and utilizes SAW of an "n-th" mode (n=0, 1 or 2) having a wavelength of $\lambda_n$ (μm), wherein a parameter of $kh_1 = 2\pi(t_1/\lambda_n)$ is in a specific range provided that the thickness of the LiNbO$_3$ layer is denoted by $t_1$ (μm).

17 Claims, 29 Drawing Sheets

(ELECTRODE ARRANGEMENT C)

ELECTRODE ELEMENT INTERSECTION WIDTH : W
ELECTRODE ELEMENT WIDTH : d ( LAYER STRUCTURE 1 )

( LAYER STRUCTURE 2 )

(ELECTRODE ARRANGEMENT A)

(ELECTRODE ARRANGEMENT C)

( ELECTRODE ARRANGEMENT E )

( ELECTRODE ARRANGEMENT F )

(Electrode Arrangement A)

(Kh$_2$ = 1.0)

SURFACE ACOUSTIC WAVE DEVICE

BACKGROUND OF THE INVENTION

1. Field of the Invention

The present invention relates to a surface acoustic wave device which has been improved both in propagation velocity (V) of surface acoustic wave to be used therein, and in electro-mechanical coupling coefficient ($K^2$) thereof.

2. Related Background Art

A surface acoustic wave device (hereinafter, mainly referred to as "SAW device"), i.e., a device which utilizes surface acoustic wave (hereinafter, mainly referred to as "SAW") propagating along the surface of a solid material, has various features or advantages common to electro-mechanical functional parts or devices. Such features are as follows:

(1) It has a small size and is light in weight.
(2) It has excellent resistance to vibration and to impact to be applied thereto.
(3) It is liable to provide little dispersion or scattering in product quality even in the mass production thereof, and therefore it is liable to provide a high reliability.
(4) When a circuit including a SAW device is constituted, the SAW device may be mounted or assembled to such a circuit in a so-called "adjustment-free" manner (or in a manner such that substantially no adjustment of the SAW device is required), and therefore the actual mounting of the SAW device may easily be automated or simplified.

In addition to the above-mentioned features common to the electro-mechanical functional parts or devices, the SAW device further has various advantages such that it has excellent stability to temperature, has a long life (or service life), and has an excellent phase characteristic. Accordingly, the SAW device may suitably be used for a wide variety of purposes such as frequency filter, resonator, delay devices signal processing device, convolver, and function element for optoelectronic devices.

In the field of communication technology inclusive of satellite communication system, mobile communication system, etc., along with recent multi-channel and high-frequency development, there has strongly been desired the development of a SAW device which is operable in a higher frequency region (e.g., GHz band) in the field of the above-mentioned SAW device.

In general, the operating frequency (f) of a SAW device may be determined on the basis of a relationship of $f=V/\lambda$, wherein V denotes the propagation velocity of SAW to be used in the SAW device, and $\lambda$ denotes the wavelength of the SAW. The wavelength $\lambda$ depends on the pitch (or period) of an interdigital transducer or electrode having a comb-like shape (hereinafter, referred to as "IDT") constituting the SAW device, as described hereinafter. However, in view of a certain limit in the field of microfabrication technique such as photolithography, it is difficult to extremely shorten the wavelength $\lambda$ of the SAW to be utilized in the SAW device. Accordingly, for the purpose of high-frequency development in the SAW device, it is desirable to increase the propagation velocity V of the SAW.

In addition, in the field of communication technology such as satellite communication system and mobile communication system as described above, mainly from a viewpoint of actual mounting of a SAW device, it has been desired to improve the entirely of the device so as to further reduce the energy consumption therein and to attain further miniaturization thereof. As a result, in addition to the high-frequency development as described above, it has been desired to improve the electro-mechanical coupling coefficient ($K^2$) of the SAW device, i.e., an index to conversion efficiency at the time of the conversion of electric energy into mechanical energy in the device.

Accordingly, particularly in a SAW device to be desirably used widely in recent years, it has strongly been demanded that not only the propagation velocity V of the SAW to be utilized in the SAW device should be increased (for example, V≧about 7000 m/s), but also the mechanical coupling coefficient ($K^2$) of the SAW device should be increased (for example, $K^2 \geq 2\%$).

There is known a SAW device having a laminate structure comprising a diamond layer and an $LiNbO_3$ layer disposed thereon (Japanese Laid-open Patent Application (KOKAI) No. 62911/1989 (i.e., Sho 64-62911). The above-mentioned $LiNbO_3$ has an advantage such that the chemical stability (i.e., resistance to acid, resistance to alkali, etc.) thereof is superior to that of another piezoelectric material such as ZnO. However, in view of the crystallinity or crystal structure of the $LiNbO_3$ material itself, it is not easy to form a thin film of $LiNbO_3$ which is capable of providing a desirable piezoelectric property as a component constituting a SAW device. Particularly, in the prior art, it has not been known what kind of $LiNbO_3$ thin film may provide a desirable characteristic as a SAW device in relation with a certain electrode arrangement or electrode structure (electrode width, etc.).

SUMMARY OF THE INVENTION

An object of the present invention is to provide a SAW device which has solved the above-mentioned problems encountered in the prior art.

Another object of the present invention is to provide a SAW device which is capable of providing a desirable characteristic while using an $LiNbO_3$ layer as a piezoelectric substance.

A further object of the present invention is to provide a SAW device wherein the propagation velocity (V) of SAW to be utilized has been increased, and the electro-mechanical coupling coefficient ($K^2$) has been improved.

As a result of earnest study, the present inventors have found that in a SAW device having an $LiNbO_3$/diamond layer structure provided with an IDT (or an electrode having a comb-like shape), a polycrystalline C-axis-oriented $LiNbO_3$ layer in combination with a specific parameter of $kh_1=2\pi(t_1/\lambda)$ (wherein $\lambda$ denotes the wavelength (μm) of SAW to be utilized in the device, and $t_1$ denotes the thickness (μm) of $LiNbO_3$ layer) which has been controlled so as to fall within a specific range, is extremely effective in achieving the above-mentioned objects.

The SAW device according to the present invention is based on the above discovery and comprises: at least, diamond, an interdigital transducer disposed on the diamond, and a polycrystalline C-axis-oriented $LiNbO_3$ layer disposed on the interdigital transducer; the surface acoustic wave device utilizing surface acoustic wave of zero-th mode having a wavelength of $\lambda$ (μm), and having a parameter of $kh_1=2\pi(t_1/\lambda)$ satisfying a relationship of $0.7 \leq kh_1 \leq 1.0$ provided that the thickness of the $LiNbO_3$ layer is $t_1$ (μm).

According to the present invention, there is provided a SAW device having a desirable characteristic while utilizing $LiNbO_3$, which has heretofore been considered as a piezoelectric substance capable of hardly forming a thin film with a desirable piezoelectric characteristic, and while effectively alleviate the trouble to be caused in the case of actual "trial and error" operation for fabricating a large number of SAW device samples. More specifically, the SAW device having such a structure may provide a SAW propagation velocity V satisfying a relationship of $7000 \leq V \leq 7500$ m/s and an electro-mechanical coupling coefficient $K^2$ satisfying a relationship of $K^2 \geq 2\%$.

The present invention also provides a surface acoustic wave device having the above structure, wherein the diamond comprises a diamond layer disposed on a base material, the surface acoustic wave device having a parameter of $kh_2 = 2\pi(t_2/\lambda)$ satisfying a relationship of $4 \leq kh_2$ provided that the thickness of the diamond layer is $t_2$ (μm). The SAW device having such a structure may be provided on a substrate such as silicon substrate, while attaining a SAW propagation velocity V satisfying a relationship of $7000 \leq V \leq 7500$ m/s and an electro-mechanical coupling coefficient $K^2$ satisfying a relationship of $K^2 \geq 1\%$.

The present invention further provides a surface acoustic wave device, comprising: at least, diamond, an interdigital transducer disposed on the diamond, and a polycrystalline C-axis-oriented LiNbO$_3$ layer disposed on the interdigital transducer; the surface acoustic wave device utilizing surface acoustic wave of 1st-mode having a wavelength of $\lambda$ (μm), and having a parameter of $kh_1 = 2\pi(t_1/\lambda)$ satisfying a relationship of $0.5 \leq kh_1 \leq 1.5$ provided that the thickness of the LiNbO$_3$ layer is $t_1$ (μm). The SAW device having such a structure may provide a SAW propagation velocity V satisfying a relationship of $7000 \leq V \leq 12000$ m/s and an electro-mechanical coupling coefficient $K^2$ satisfying a relationship of $4 \leq K^2 \leq 9\%$.

The present invention further provides a surface acoustic wave device having the above structure, wherein the parameter of $kh_1 = 2\pi(t_1/\lambda)$ satisfies a relationship of $0.5 \leq kh_1 \leq 1.0$. The SAW device having such a structure may provide a SAW propagation velocity V satisfying a relationship of $9000 \leq V \leq 12000$ m/s and an electro-mechanical coupling coefficient $K^2$ satisfying a relationship of $6 \leq K^2 \leq 9\%$.

The present invention further provides a surface acoustic wave device having the above structure, wherein the diamond comprises a diamond layer disposed on a base material, and a parameter of $kh_2 = 2\pi(t_2/\lambda)$ satisfies a relationship of $2 \leq kh_2$ provided that the thickness of the diamond layer is $t_2$ (μm). The SAW device having such a structure may be provided on a substrate such as silicon substrate, while attaining a SAW propagation velocity V satisfying a relationship of $9000 \leq V \leq 12000$ m/s and an electro-mechanical coupling coefficient $K^2$ satisfying a relationship of $6 \leq K^2 \leq 9\%$.

The present invention further provides a surface acoustic wave device having the above structure, wherein the parameter of $kh_1 = 2\pi(t_1/\lambda)$ satisfies a relationship of $0.5 \leq kh_1 \leq 0.8$, and the parameter of $kh_2 = 2\pi(t_2/\lambda)$ satisfies a relationship of $2 \leq kh_2 \leq 3$. The SAW device having such a structure may provide a SAW propagation velocity V satisfying a relationship of $10000 \leq V \leq 12000$ m/s and an electro-mechanical coupling coefficient $K^2$ satisfying a relationship of $9 \leq K^2 \leq 11\%$.

The present invention further provides a surface acoustic wave device, comprising: at least, diamond, a polycrystalline C-axis-oriented LiNbO$_3$ layer disposed on the diamond, and an interdigital transducer disposed on the LiNbO$_3$ layer; the surface acoustic wave device utilizing surface acoustic wave of 1st-mode having a wavelength of $\lambda$ (μm), and having a parameter of $kh_1 = 2\pi(t_1/\lambda)$ satisfying a relationship of $0.5 \leq kh_1 \leq 1.5$ provided that the thickness of the LiNbO$_3$ layer is $t_1$ (μm). The SAW device having such a structure may provide a SAW propagation velocity V satisfying a relationship of $7000 \leq V \leq 12000$ m/s and an electro-mechanical coupling coefficient $K^2$ satisfying a relationship of $2 \leq K^2 \leq 9\%$.

The present invention further provides a surface acoustic wave device having the above structure, wherein the parameter of $kh_1 = 2\pi(t_1/\lambda)$ satisfies a relationship of $0.5 \leq kh_1 \leq 1.0$. The SAW device having such a structure may provide a SAW propagation velocity V satisfying a relationship of $9000 \leq V \leq 12000$ m/s and an electro-mechanical coupling coefficient $K^2$ satisfying a relationship of $6 \leq K^2 \leq 9\%$.

The present invention further provides a surface acoustic wave device having the above structure, wherein the diamond comprises a diamond layer disposed on a base material, and a parameter of $kh_2 = 2\pi(t_2/\lambda)$ satisfies a relationship of $2 \leq kh_2$ provided that the thickness of the diamond layer is $t_2$ (μm). The SAW device having such a structure may be provided on a substrate such as silicon substrate, while attaining a SAW propagation velocity V satisfying a relationship of $9000 \leq V \leq 12000$ m/s and an electro-mechanical coupling coefficient $K^2$ satisfying a relationship of $6 \leq K^2 \leq 9\%$.

The present invention further provides a surface acoustic wave device having the above structure, wherein the parameter of $kh_1 = 2\pi(t_1/\lambda)$ satisfies a relationship of $0.5 \leq kh_1 \leq 0.8$, and the parameter of $kh_2 = 2\pi(t_2/\lambda)$ satisfies a relationship of $2 \leq kh_2 \leq 3$. The SAW device having such a structure may provide a SAW propagation velocity V satisfying a relationship of $10000 \leq V \leq 12000$ m/s and an electro-mechanical coupling coefficient $K^2$ satisfying a relationship of $8 \leq K^2 \leq 10\%$.

The present invention further provides a surface acoustic wave device, comprising: at least, diamond, a polycrystalline C-axis-oriented LiNbO$_3$ layer disposed on the diamond, and an interdigital transducer disposed on the LiNbO$_3$ layer; the surface acoustic wave device utilizing surface acoustic wave of 2nd-mode having a wavelength of $\lambda$ (μm), and having a parameter of $kh_1 = 2\pi(t_1/\lambda)$ satisfying a relationship of $1.4 \leq kh_1 \leq 3$ provided that the thickness of the LiNbO$_3$ layer is $t_1$ (μm). The SAW device having such a structure may provide a SAW propagation velocity V satisfying a relationship of $8000 \leq V \leq 11000$ m/s and an electro-mechanical coupling coefficient $K^2$ satisfying a relationship of $2 \leq K^2 \leq 4\%$.

The present invention further provides a surface acoustic wave device having the above structure, wherein the diamond comprises a diamond layer disposed on a base material, and a parameter of $kh_2 = 2\pi(t_2/\lambda)$ satisfies a relationship of $4 \leq kh_2$ provided that the thickness of the diamond layer is $t_2$ (μm). The SAW device having such a structure may be provided on a substrate such as silicon substrate, while attaining a SAW propagation velocity V satisfying a relationship of $8000 \leq V \leq 11000$ m/s and an electro-mechanical coupling coefficient $K^2$ satisfying a relationship of $2 \leq K^2 \leq 4\%$.

The present invention further provides a surface acoustic wave device, comprising: at least, diamond, an interdigital transducer disposed on the diamond, a polycrystalline C-axis-oriented LiNbO$_3$ layer disposed on the interdigital transducer, and a short-circuiting electrode disposed on the LiNbO$_3$ layer; the surface acoustic wave device utilizing surface acoustic wave of 1st-mode having a wavelength of $\lambda$ (μm), and having a parameter of $kh_1 = 2\pi(t_1/\lambda)$ satisfying a relationship of $0.5 \leq kh_1 \leq 1.5$ provided that the thickness of the LiNbO$_3$ layer is t$_1$ (μm). The SAW device having such a structure may provide a SAW propagation velocity V satisfying a relationship of 7000≤V≤12000 m/s and an electro-mechanical coupling coefficient K$^2$ satisfying a relationship of 2≤K$^2$≤4%.

The present invention further provides a surface acoustic wave device having the above structure, wherein the diamond comprises a diamond layer disposed on a base material. The SAW device having such a structure may be provided on a substrate such as silicon substrate, while attaining a SAW propagation velocity V satisfying a relationship of 7000≤V≤12000 m/s and an electro-mechanical coupling coefficient K$^2$ satisfying a relationship of 2≤K$^2$≤4%.

The present invention further provides a surface acoustic wave device, comprising: at least, diamond, an interdigital transducer disposed on the diamond, a polycrystalline C-axis-oriented LiNbO$_3$ layer disposed on the interdigital transducer, and a short-circuiting electrode disposed on the LiNbO$_3$ layer; the surface acoustic wave device utilizing surface acoustic wave of 2nd-mode having a wavelength of λ (μm), and having a parameter of kh$_1$=2π(t$_1$/λ) satisfying a relationship of 1.5≤kh$_1$≤3 provided that the thickness of the LiNbO$_3$ layer is t$_1$ (μm). The SAW device having such a structure may provide a SAW propagation velocity V satisfying a relationship of 8000≤V≤10000 m/s and an electro-mechanical coupling coefficient K$^2$ satisfying a relationship of 2≤K$^2$≤2.6%.

The present invention further provides a surface acoustic wave device having the above structure, wherein the diamond comprises a diamond layer disposed on a base material. The SAW device having such a structure may be provided on a substrate such as silicon substrate, while attaining a SAW propagation velocity V satisfying a relationship of 8000≤V≤10000 m/s and an electro-mechanical coupling coefficient K$^2$ satisfying a relationship of 2≤K$^2$≤2.6%.

The present invention further provides a surface acoustic wave device, comprising: at least, diamond, a short-circuiting electrode disposed on the diamond, a polycrystalline C-axis-oriented LiNbO$_3$ layer disposed on the short-circuiting electrode, and an interdigital transducer disposed on the LiNbO$_3$ layer; the surface acoustic wave device utilizing surface acoustic wave of 1st-mode having a wavelength of λ (μm), and having a parameter of kh$_1$=2π(t$_1$/λ) satisfying a relationship of 0.5≤kh$_1$≤1.5 provided that the thickness of the LiNbO$_3$ layer is t$_1$ (μm). The SAW device having such a structure may provide a SAW propagation velocity V satisfying a relationship of 7000≤V≤12000 m/s and an electro-mechanical coupling coefficient K$^2$ satisfying a relationship of 1.4≤K$^2$≤2.4%.

The present invention further provides a surface acoustic wave device having the above structure wherein the diamond comprises a diamond layer disposed on a base material. The SAW device having such a structure may be provided on a substrate such as silicon substrate, while attaining a SAW propagation velocity V satisfying a relationship of 7000≤V≤12000 m/s and an electro-mechanical coupling coefficient K$^2$ satisfying a relationship of 1.4≤K$^2$≤2.4%.

The present invention further provides a surface acoustic wave device, comprising: at least, diamond, a short-circuiting electrode disposed on the diamond, a polycrystalline C-axis-oriented LiNbO$_3$ layer disposed on the short-circuiting electrode, and an interdigital transducer disposed on the LiNbO$_3$ layer; the surface acoustic wave device utilizing surface acoustic wave of 2nd-mode having a wavelength of λ (μm), and having a parameter of kh$_1$=2π(t$_1$/λ) satisfying a relationship of 1.5≤kh$_1$≤3 provided that the thickness of the LiNbO$_3$ layer is t$_1$ (μm). The SAW device having such a structure may provide a SAW propagation velocity V satisfying a relationship of 8000≤V≤10000 m/s and an electro-mechanical coupling coefficient K$^2$ satisfying a relationship of 1.4≤K$^2$≤3%.

The present invention further provides a surface acoustic wave device having the above structure, wherein the diamond comprises a diamond layer disposed on a base material, and a parameter of kh$_2$=2π(t$_2$/λ) satisfies a relationship of 4≤kh$_2$ provided that the thickness of the diamond layer is t$_2$ (μm). The SAW device having such a structure may be provided on a substrate such as silicon substrate, while attaining a SAW propagation velocity V satisfying a relationship of 8000≤V≤10000 m/s and an electro-mechanical coupling coefficient K$^2$ satisfying a relationship of 1.4 ≤K$^2$≤3%.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

Hereinbelow, the present invention will be described in detail with reference to the accompanying drawings, as desired.

Mode of SAW

In a SAW device having a structure comprising diamond, an $LiNbO_3$ layer disposed thereon, and an IDT disposed in the device so as to contact the $LiNbO_3$ layer, when SAW is excited by using the IDT, a plurality of kinds of SAWs respectively having different propagation velocities V are produced. In the present invention, among the thus produced plural kinds of SAWs, a kind of SAW having the smallest propagation velocity V is referred to as "zero-th mode SAW", a kind of SAW having the second smallest propagation velocity V is referred to as "1st-mode SAW", a kind of SAW having the third smallest propagation velocity V is referred to as "2nd-mode SAW", et seq.

Figure 1:
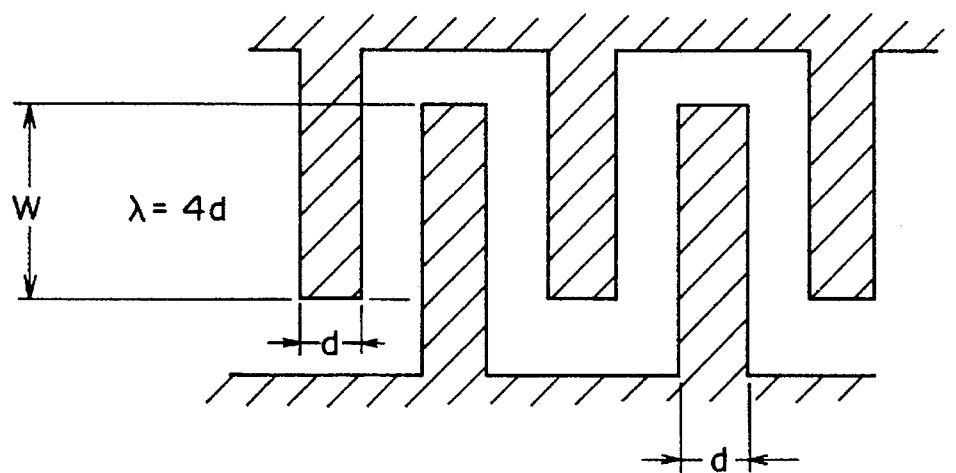
FIG. 1 is a schematic plan view showing an example of the planar shape of an IDT (single-type electrode) constituting a SAW device.
Figure 2:
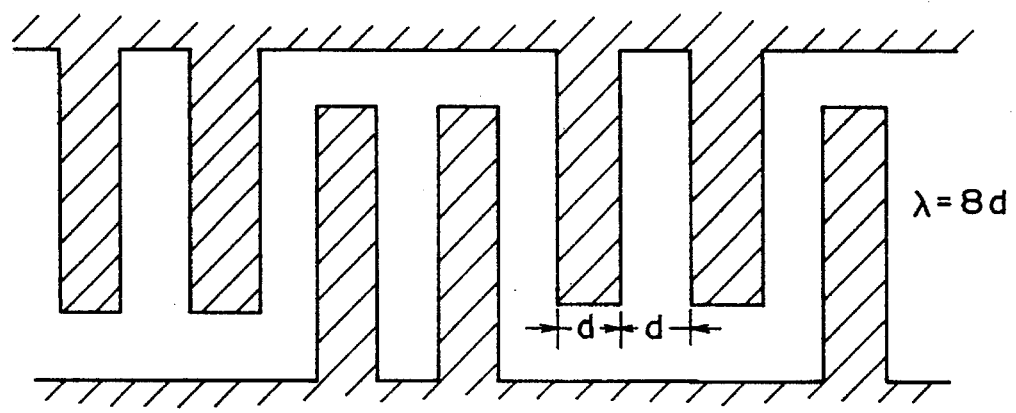
FIG. 2 is a schematic plan view showing an example of the planar shape of an IDT (double-type electrode) constituting a SAW device.

Accordingly, the mode of SAW utilized in a SAW device may be determined by measuring the propagation velocity V of the SAW at an operating frequency of the SAW device. For Example, the propagation velocity V may be determined by using a relationship of V=fλ, wherein f denotes the center frequency, and λ denotes the wavelength which depends on the electrode (element) width of the IDT. In a case where the IDT constituting a SAW device comprises a single-type electrode having a planar shape as shown in FIG. 1 (electrode element width=d), λ=4d. On the other hand, in a case where the IDT constituting a SAW device comprises a double-type electrode having a planar shape as shown in FIG. 2 (electrode element width=d), λ=8d.

Layer Structure

Figure 3:
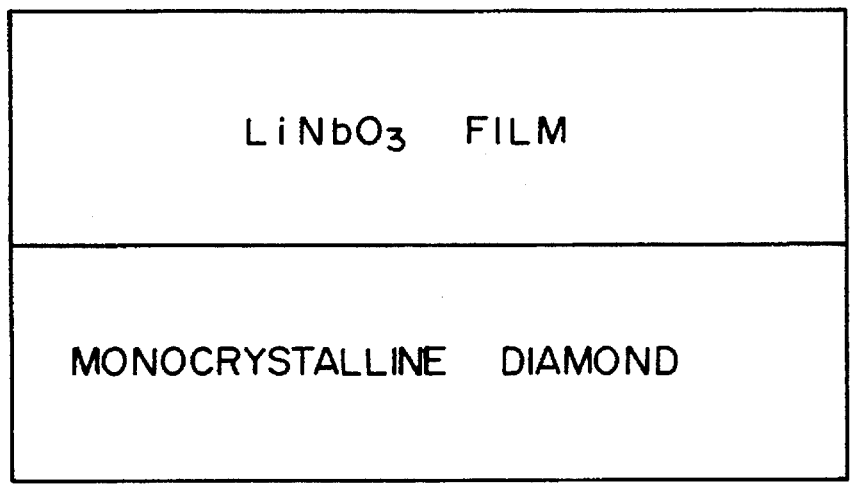
FIG. 3 is a schematic sectional view showing a layer structure (Layer Structure 1) of an embodiment of the SAW device according to the present invention.

FIG. 3 is a schematic sectional view showing an example of the layer (or laminate) structure ("Layer Structure 1") of a SAW device according to the present invention. Referring to FIG. 3, the SAW device in this embodiment comprises at least, diamond, an $LiNbO_3$ layer disposed on the diamond, and an IDT (not shown) disposed in the device so as to contact the $LiNbO_3$ layer. This SAW device utilizes SAW of an "n-th" mode (n=0, 1 or 2) having a wavelength of $\lambda_n$ (μm). In the SAW device in this embodiment, when the thickness of the $LiNbO_3$ layer is denoted by $t_1$ (μm), a parameter of $kh_1=2\pi(t_1/\lambda_n)$ is in a specific range.

Figure 4:
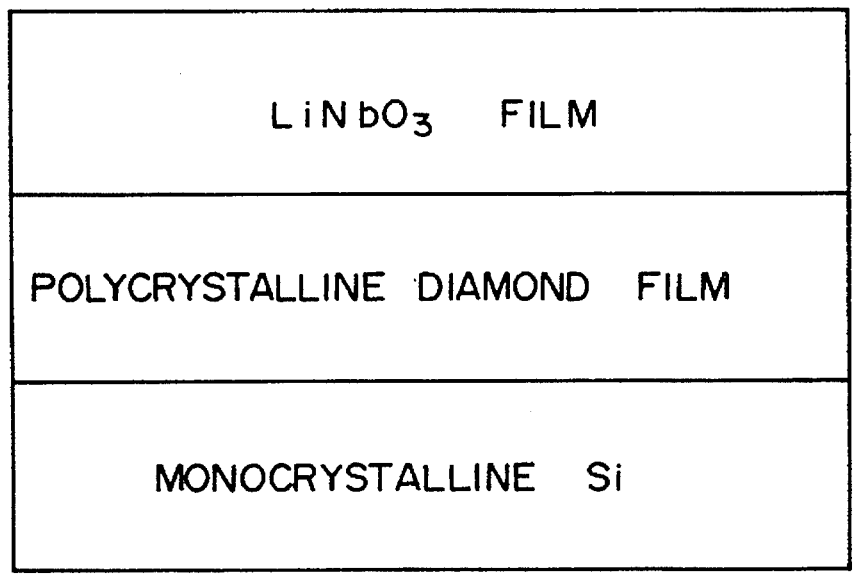
FIG. 4 is a schematic sectional view showing a layer structure (Layer Structure 2) of an embodiment of the SAW device according to the present invention.

In an embodiment of the present invention (an embodiment as shown in FIG. 4, i.e., Layer Structure 2) wherein the above diamond comprises a diamond layer disposed on another substrate (or base material), when the thickness of such a diamond layer is denoted by $t_2$ (μm), a parameter of $kh_2=2\pi(t_2/\lambda_n)$ is in a specific range.

Electrode Arrangement

In the SAW device according to the present invention, it is preferred to use an electrode arrangement of IDT (in addition, a short-circuiting electrode, as desired) selected from those shown in the schematic sectional views of FIGS. 5 to 8.

Figure 5:
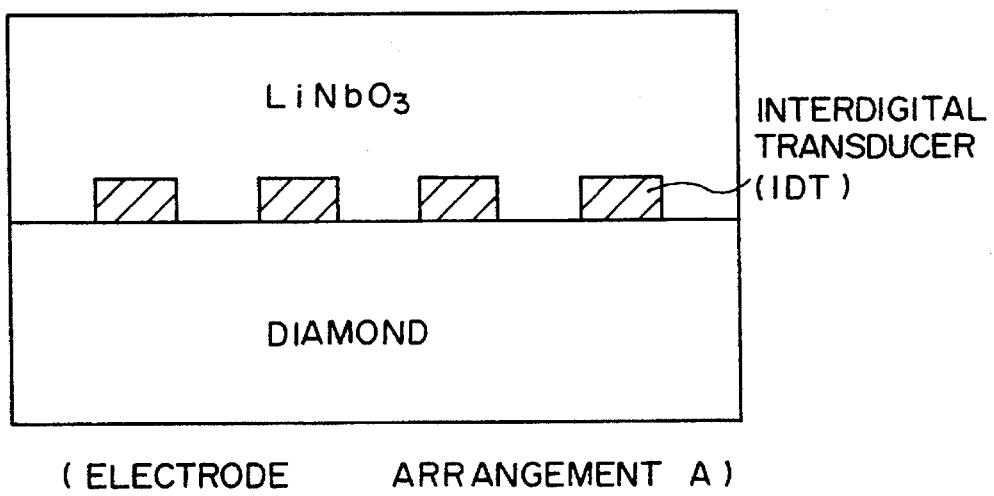
FIG. 5 is a schematic sectional view showing an electrode arrangement (Electrode Arrangement A) of an embodiment of the SAW device according to the present invention.

In the arrangement (Electrode Arrangement A) shown in FIG. 5, the SAW device comprises diamond, an IDT disposed on the diamond, and an $LiNbO_3$ layer disposed on the IDT. The arrangement (Electrode Arrangement C) shown in FIG. 6 further comprises a short-circuiting electrode disposed on the $LiNbO_3$ layer constituting the above-mentioned "Electrode Arrangement A".

Figure 7:
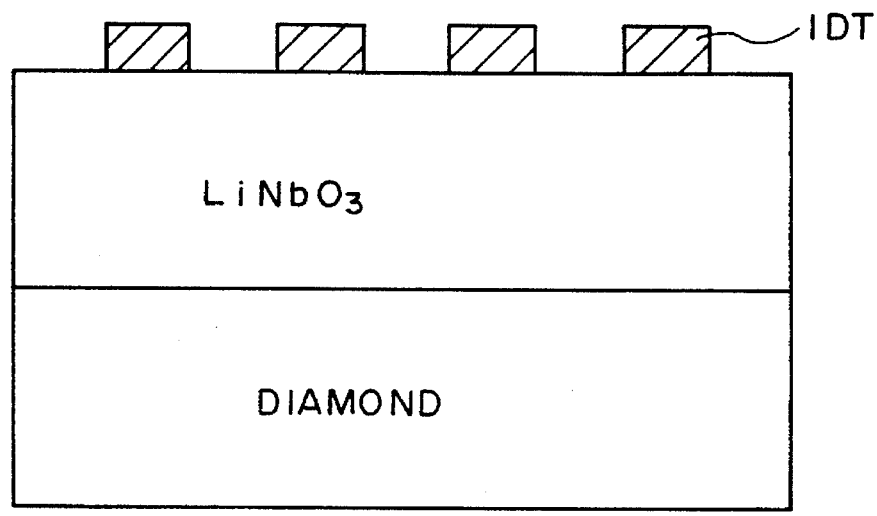
FIG. 7 is a schematic sectional view showing an electrode arrangement (Electrode Arrangement E) of an embodiment of the SAW device according to the present invention.

In the arrangement (Electrode Arrangement E) shown in FIG. 7, the SAW device comprises diamond, an $LiNbO_3$ layer disposed on the diamond, and an IDT disposed on the $LiNbO_3$ layer. The arrangement (Electrode Arrangement F) shown in FIG. 8 further comprises a short-circuiting electrode disposed between the diamond and the $LiNbO_3$ layer constituting the above-mentioned "Electrode Arrangement E".

Constitution or Structure of Respective Layers

Hereinbelow, the respective layers constituting the SAW device according to the present invention will be described in detail.

Diamond

In the present invention, the diamond constituting the SAW device may comprise monocrystalline diamond and/or polycrystalline diamond. The process or method for providing or producing such diamond is not particularly limited. More specifically, for example, the diamond may comprise monocrystalline diamond, or a diamond film as a polycrystalline film or epitaxial film which has been grown on another material (base material) by using a vapor-phase deposition process.

The base material for diamond film formation is not particularly limited, but may appropriately be selected depending on the usage of the SAW device. For example, the base material to be usable in the present invention may comprise semiconductor such as Si, metal, glass, ceramic, etc.

In the present invention, in a case where the above diamond comprises a diamond film, the process or method for growing the diamond (thin) film is not particularly limited. More specifically, the growth process to be used for such a purpose may appropriately be selected from known processes inclusive of: a CVD (Chemical Vapor Deposition) method, a microwave plasma CVD method, a PVD (Physical Vapor Deposition) method, a sputtering method, an ion plating method, a plasma jet method, a flame method, a hot filament method, etc.

The plane orientation of the above diamond or diamond film is not particularly limited. For example, the plane orientation of the diamond (film) may be any of (111), (100) and (110), etc., and may be any combination of these plane orientations.

Orientational Property of $LiNbO_3$ Film

In the present invention, the $LiNbO_3$ film to be disposed on the above-mentioned diamond is polycrystalline, and comprises an $LiNbO_3$ film wherein the (001) plane thereof is parallel to a base material surface (so-called "C-axis-oriented film") in view of piezoelectric property, etc.

In the present invention, the orientational property of an $LiNbO_3$ film may be evaluated by, e.g., an X-ray rocking (curve) pattern method, as one of the methods of evaluating the orientational property of a crystal face or crystal plane. More specifically, the orientational property (in-plane orientational property) may be evaluated in the following manner.

(1) A sample to be measured is placed in a sample holder of an X-ray diffractometer.

(2) The plane orientation of a face to be evaluated is measured by using an X-ray diffraction pattern method utilizing the above-mentioned X-ray diffractometer.

(3) The θ-axis (corresponding to the rotation of the sample to be measured) and the 2θ-axis (corresponding to an X-ray counter of the X-ray diffractometer) are rotated and then fixed so that the θ- and 2θ-axes provide a maximum output value in orientation of the face to be evaluated. In the case of an $LiNbO_3$ film of which C-axis is oriented perpendicularly to a base substance on which the $LiNbO_3$ film is to be disposed, 2θ is 39° with respect to the (006) peak.

(4) Only the sample (i.e., the θ-axis) is rotated and a rocking curve is obtained by such measurement.

(5) The thus obtained rocking curve is regarded as one having a Gaussian distribution, and a standard deviation σ thereof is determined (With respect to the details of the rocking curve, a paper entitled "Preparation of ZnO Films by an Activated Reactive Evaporation Method" written by Yoshinari Miura et al.; "ZAIRYO" (Materials), 40, No. 451 (April, 1991) may be referred to).

As the standard deviation σ of the rocking curve measured in the above-described manner has a smaller value, it indicates a higher orientational property of the sample (LiNbO$_3$) to be evaluated. In the SAW device according to the present invention, the σ value may preferably be 8° or less (more preferably, 4° or less). (IDT)

In the SAW device according to the present invention, the substance to be used for the IDT is not particularly limited, as long as it comprises an electroconductive substance. In view of processability or workability and production cost, Al (aluminum) may particularly preferably be used as the substance constituting the IDT.

The thickness of the IDT is not particularly limited, as long as it functions as an IDT of a SAW device. In general, the thickness of the IDT may preferably be in the range of about 100 to 5,000 Å (more preferably, about 100 to 500 Å). When the thickness of the IDT is less than 100 Å, the electrode resistivity is increased to cause an increase in loss. On the other hand, when the thickness of the IDT exceeds 5,000 Å, it provides a considerable mass addition effect which is liable to cause reflection of SAW due to the thickness and height of the electrode, and it becomes difficult to obtain a desired SAW characteristic of the SAW device.

The planar or two-dimensional shape of the IDT is not particularly limited, as long as it may function as an IDT of the SAW device. As the IDT, a so-called "single-type" electrode as shown in the schematic plan view of FIG. 1 or a so-called "double-type" electrode as shown in the schematic plan view of FIG. 2 may preferably be used.

As desired, the above-mentioned IDT may be embedded in a surface (e.g., a surface of diamond having a specific orientational property such as (111)) on which the IDT is to be disposed. More specifically, for example, a recessed or indented portion having a shape such as groove may be formed (or a predetermined surface having a recessed portion may be formed in advance), and at least a part of (i.e., all or a part of) a conductive substance, such as Al, constituting the IDT may be embedded in the recessed portion. When all or a part of the IDT is embedded in this manner, for example, the surface level or height of the IDT can be made substantially equal to the surface on which the IDT is to be formed. As a result, an influence of SAW reflection caused by the thickness of the IDT can be reduced.

Short-Circuiting Electrode

In the SAW device according to the present invention, the short-circuiting electrode to be disposed as desired, is an electrode having a function of providing an equipotential state to an electric field so as to change the SAW characteristic of the device. This electrode may preferably comprise a (thin) film of a metal such as Al, Au and Al-Cu. Since the short-circuiting electrode has a function different from that of the IDT as described above, the substance constituting the short-circuiting electrode is not necessarily the same as that of the IDT.

The thickness of the short-circuiting electrode is not particularly limited, as long as it may function as a short-circuiting electrode of a SAW device. The thickness of the short-circuiting electrode may preferably be in the range of about 50 to 3,000 Å (more preferably, about 100 to 500 Å). When the thickness is less than 50 Å, it is difficult to obtain an equipotential state as described above. On the other hand, when the thickness exceeds 3,000 Å, it is liable to affect the reflection of SAW.

For example, the short-circuiting electrode may preferably has a two-dimensional shape as a "solid electrode" having an area substantially equal to that of the IDT to be used in combination therewith.

Hereinbelow, the present invention will be described in more detail with reference to specific Examples.

EXAMPLE 1

A polycrystalline diamond film was formed on a (100) face of monocrystalline silicon by use of the following microwave plasma CVD method, and then the resultant diamond surface was polished, thereby to form four species of diamond films having a thickness of 1.3–5μm.

<Diamond Film Formation Conditions>

Microwave power: 150 W

Reactant gas: $CH_4:H_2=1:100$

Reaction pressure: 40 Torr

Film Formation Temperature: 850° C.

Film thickness (after the surface polishing): 1.3 μm, 2.6 μm, 3.8 μm, and 5.1 μm Then, on each of the thus formed diamond films, an IDT (planer shape: double-type electrode as shown in FIG. 2, electrode element width d=1 μm, pitch=8 μm) having a thickness of 400 Å was formed by use of Al, and thereafter an LiNbO$_3$ film (film thickness: 0.13–5.1 μm, 40 kinds) was formed by using an RF magnetron sputtering method, thereby to fabricate SAW device samples having a layer structure (Layer Structure 2) as shown in FIG. 4, and an electrode arrangement (Electrode Arrangement A) as shown in FIG. 5 (number of electrode element pairs of input IDT: 30, number of electrode element pairs of output IDT: 30, distance between centers of input and output electrodes: 400 μm). All of the thus formed LiNbO$_3$ films were C-axis oriented films, and the σ value of the X-ray rocking curve of each LiNbO$_3$ film was 2°–3°.

<RF Magnetron Sputtering Conditions>

Pressure: $1 \times 10^{-2}$ Torr

Substrate temperature: 650° C.

Ar:O$_2$=1:1

RF power: 150 W

Target: Li:Nb=1:1 sintered product (sintered product produced from Li$_2$Co$_3$ and Nb$_2$O$_5$)

Film thickness: film thicknesses corresponding to values obtained by dividing the thickness of 0.13 μm to 5.1 μm (difference: 4.97 μm) into 40 equal parts (i.e., thicknesses of 0.13 μm, (0.13+4.97×1/40) μm, (0.13+ 4.97×2/40) μm, . . . , (0.13+4.97×39/40) μm, and 5.1 μm).

Figure 6:
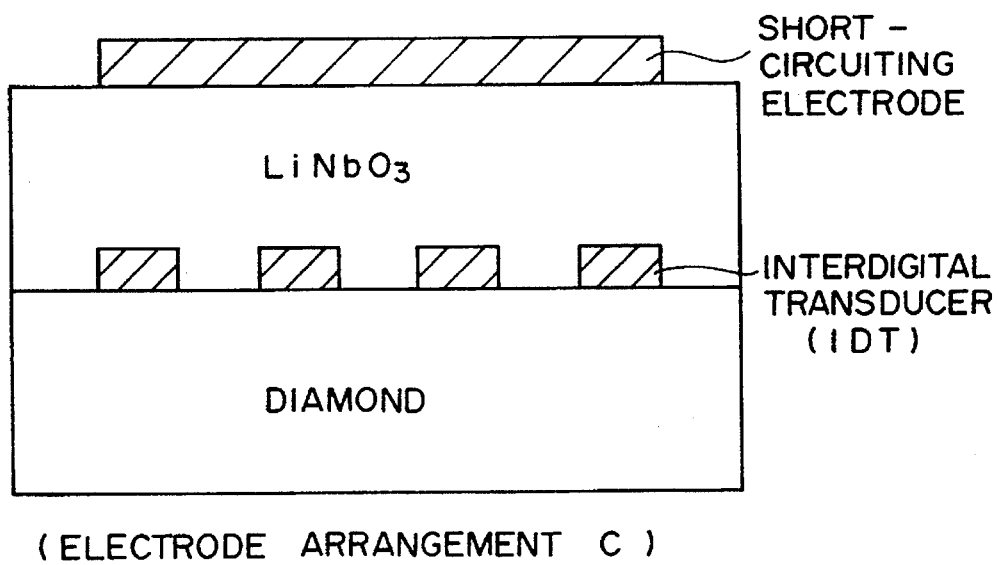
FIG. 6 is a schematic sectional view showing an electrode arrangement (Electrode Arrangement C) of an embodiment of the SAW device according to the present invention.

On the resultant SAW device (Electrode Arrangement A) fabricated above, a short-circuiting electrode having a thickness of 100 Å was further formed by use of Al, thereby to fabricate SAW devices having a layer structure as shown in FIG. 4 (Layer Structure 2) and an electrode arrangement as shown in FIG. 6 (Electrode Arrangement C).

Figure 8:
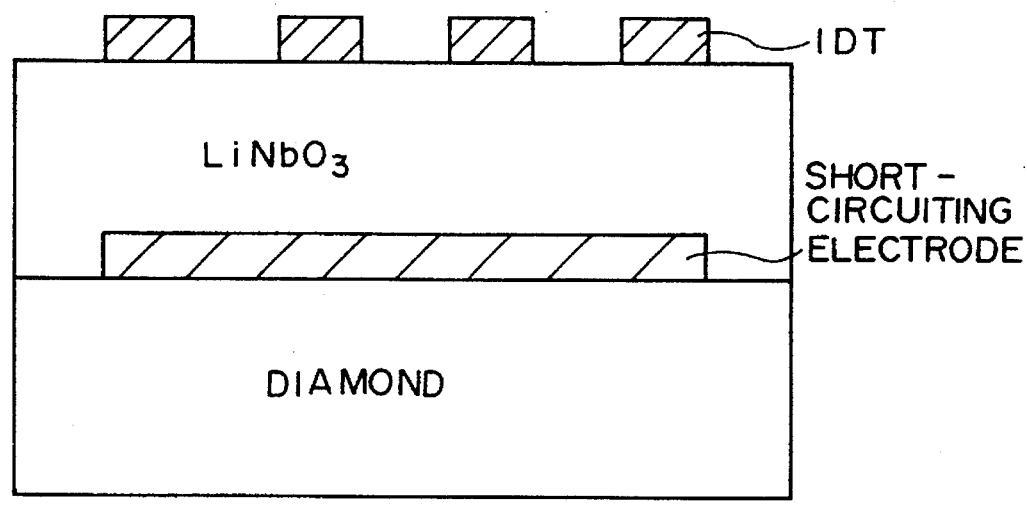
FIG. 8 is a schematic sectional view showing an electrode arrangement (Electrode Arrangement F) of an embodiment of the SAW device according to the present invention.

SAW devices having a layer structure as shown in FIG. 4 (Layer Structure 2) and an electrode arrangement as shown in FIG. 7 (Electrode Arrangement E), and SAW devices having a layer structure as shown in FIG. 4 (Layer Structure 2) and an electrode arrangement as shown in FIG. 8 (Electrode Arrangement F) were fabricated in the same manner as described above, except for changing the order of the respective layer formation.

With respect to each of the SAW devices as fabricated above, radio frequency was applied to the input IDT to generate SAW. At this time, the propagation velocities V (m/s) of the thus generated SAWs of respective modes were determined depending on a relationship of V=f×λ (f: center frequency, λ=8d= 8 μm).

On the other hand, the electro-mechanical coupling coefficient ($K^2$) was obtained by measuring the radiation conductance (wherein the real part is denoted by "G") of the IDT by using a commercially available network analyzer (trade name: Network Analyzer 8719A, available from Yokogawa-Hewlett-Packard (YHP) K.K.), and calculating a coefficient $K^2$ according to the following formula:

$$K^2=(G/8)\cdot f_0 \cdot C \cdot N$$

($f_0$: center frequency, C: total electrostatic capacitance of IDT, and N: number of electrode element pairs constituting IDT).

The thickness $t_1$ (μm) of the LiNbO$_3$ layer constituting each of the above SAW devices, and the thickness $t_2$ (μm) of the diamond layer constituting each SAW device were measured by cutting off the device after the measurement of various parameters as described above, and observing the resultant section of the device with a scanning electron microscope (SEM) at a magnification of 1000–5000×.

On the basis of the thus obtained data, the values of the parameters of $kh_1=2\pi(t_1/\lambda)$ and $kh_2=2\pi(t_2/\lambda)$ were determined with respect to each of the SAW devices having a layer structure (Layer Structure 2) shown in FIG. 4, and an electrode arrangement (any of Electrode Arrangement A, C, E and F) shown in FIGS. 5–8 (λ=8 μm).

Figure 9:
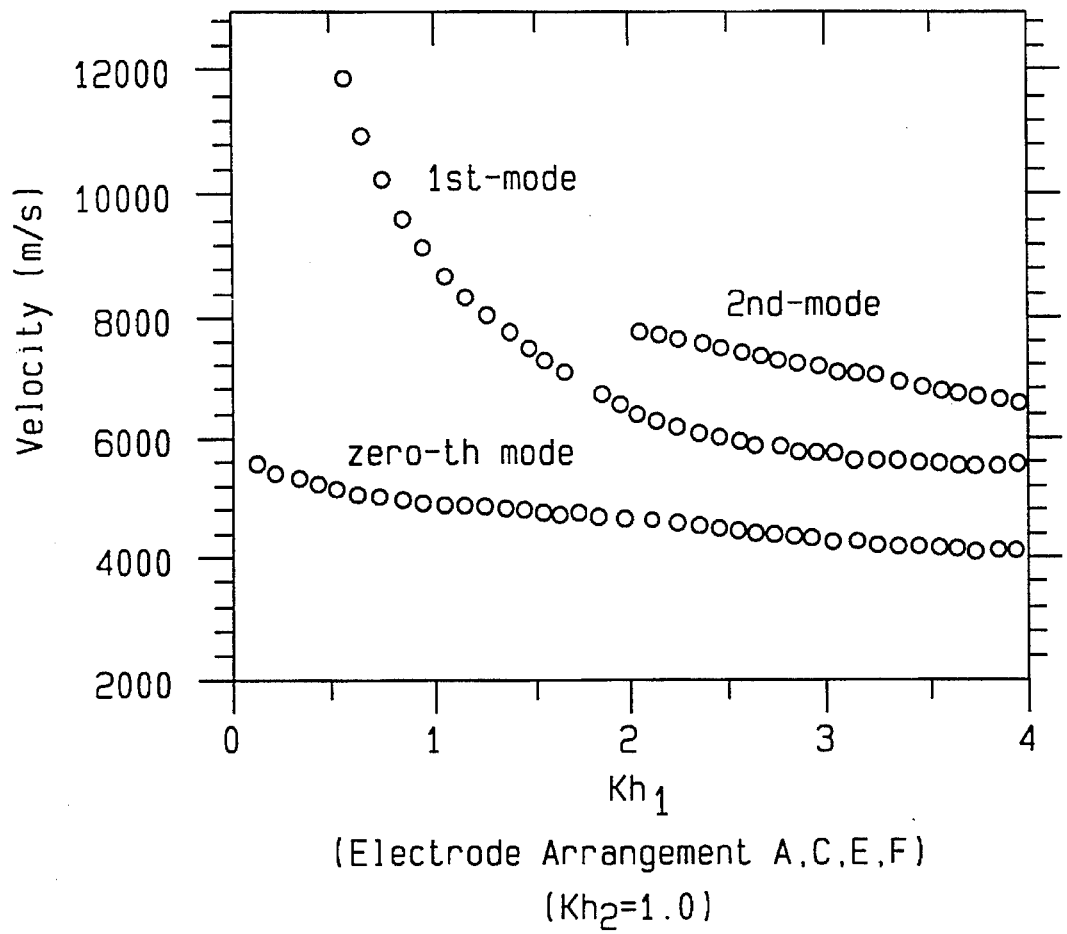
FIG. 9 is a graph showing a relationship between the propagation velocity V of SAW and the parameter kh$_1$ in a SAW device having the above-mentioned "Layer Structure 2" and the above-mentioned "Electrode Arrangement A, C, E or F" (the parameter kh$_2$=1.0).
Figure 10:
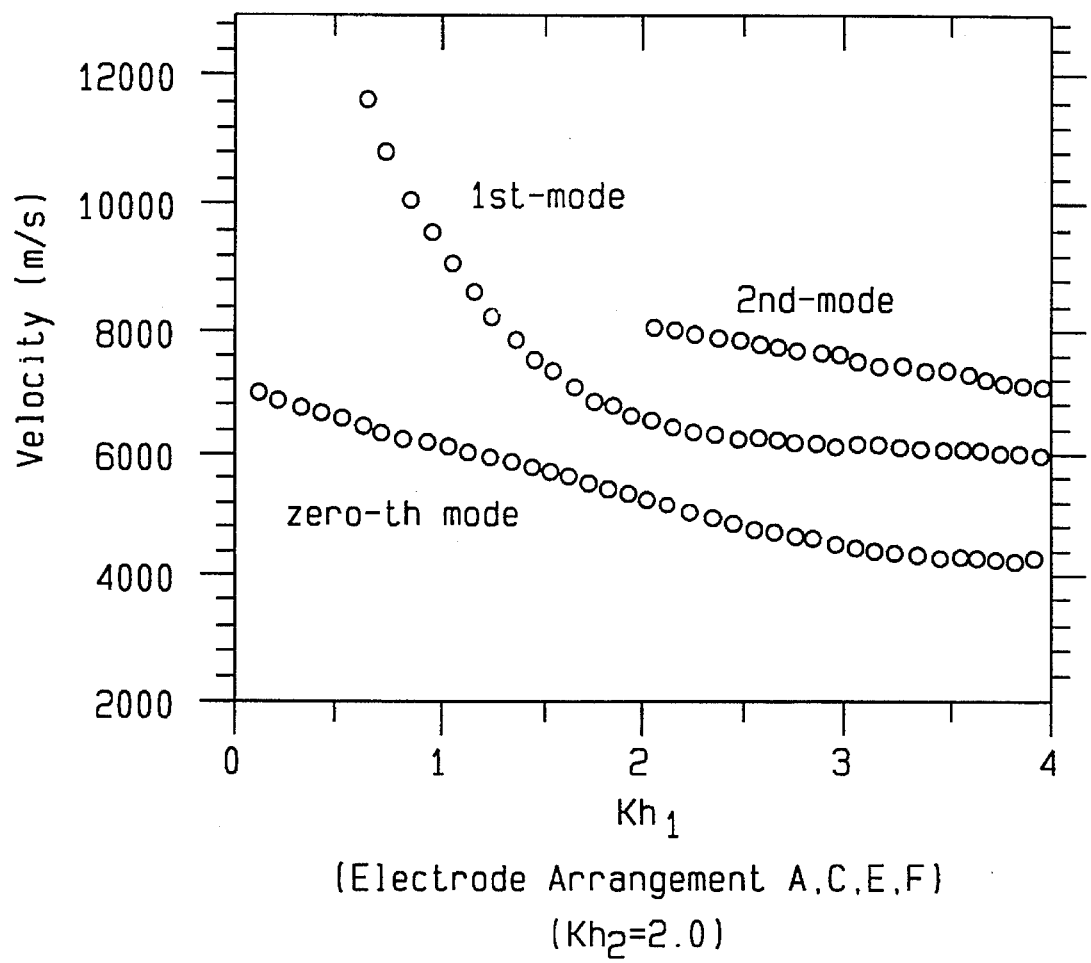
FIG. 10 is a graph showing a relationship between the propagation velocity V of SAW and the parameter kh$_1$ in a SAW device having the above-mentioned "Layer Structure 2" and the above-mentioned "Electrode Arrangement A, C, E or F" (the parameter kh$_2$=2.0).
Figure 11:
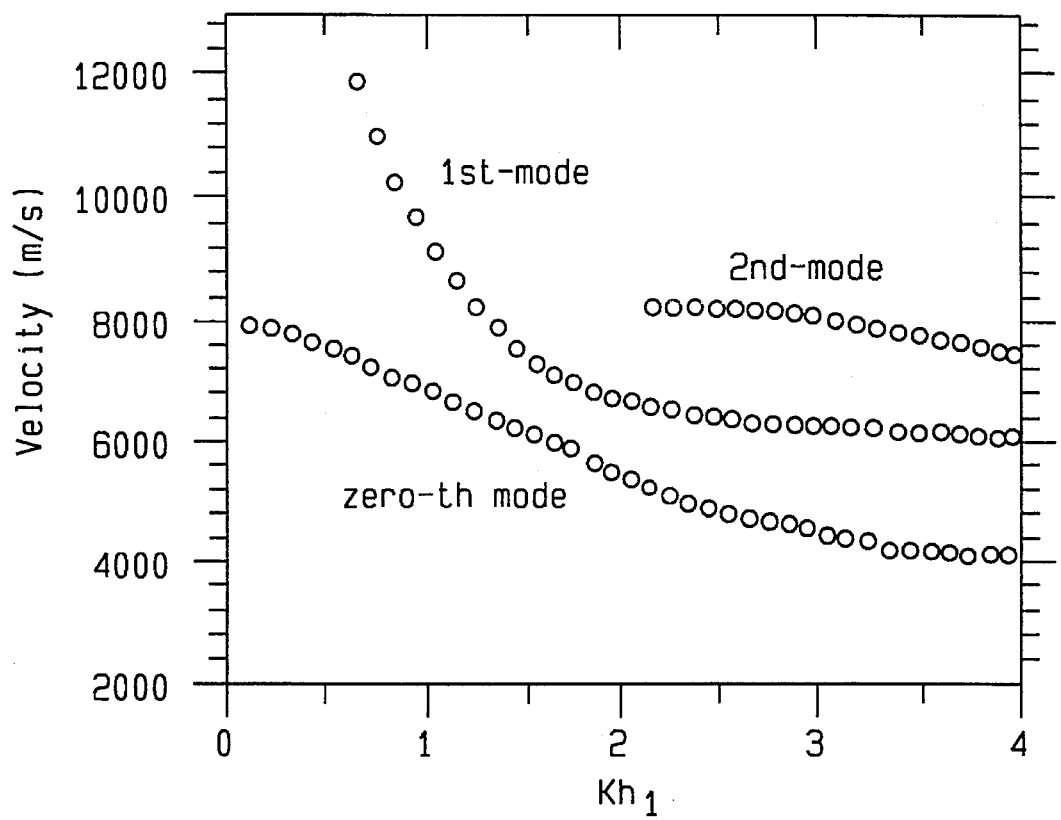
FIG. 11 is a graph showing a relationship between the propagation velocity V of SAW and the parameter $kh_1$ in a SAW device having the above-mentioned "Layer Structure 2" and the above-mentioned "Electrode Arrangement A, C, E or F" (the parameter $kh_2=3.0$).
Figure 12:
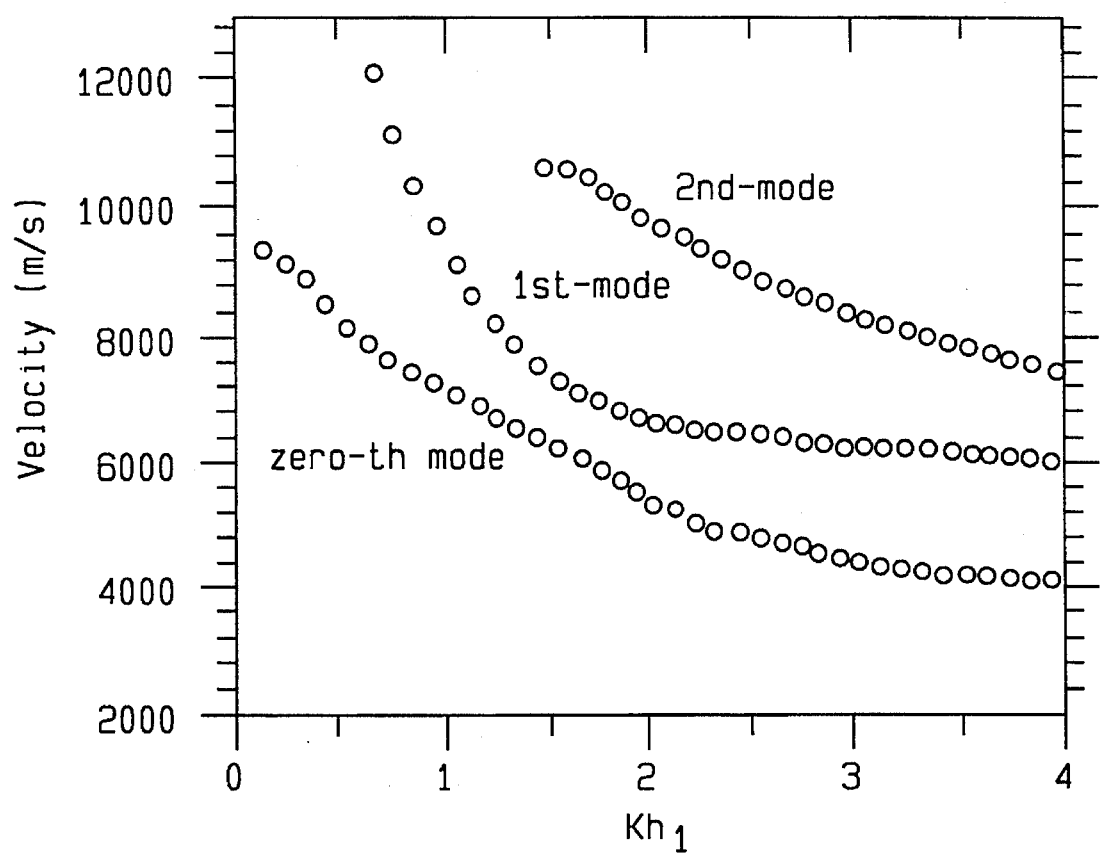
FIG. 12 is a graph showing a relationship between the propagation velocity V of SAW and the parameter $kh_1$ in a SAW device having the above-mentioned "Layer Structure 2" and the above-mentioned "Electrode Arrangement A, C, E or F" (the parameter $kh_2=4.0$).

The resultant relationships (dependency) between the propagation velocity V and the parameters $kh_1=2\pi(t_1/\lambda)$ and $kh_2=2\pi(t_2/\lambda)$ which had been determined in the above-described manner are shown in each of graphs of FIG. 9 ($kh_2$=1.0), FIG. 10 ($kh_2$=2.0), FIG. 11 ($kh_2$=3.0) and FIG. 12 ($kh_2$=4.0). It was also found that SAW devices in the case of $kh_2$=6.0 or 8.0 showed a similar tendency as that described above (i.e., tendency as shown in FIGS. 9–12).

Figure 13:
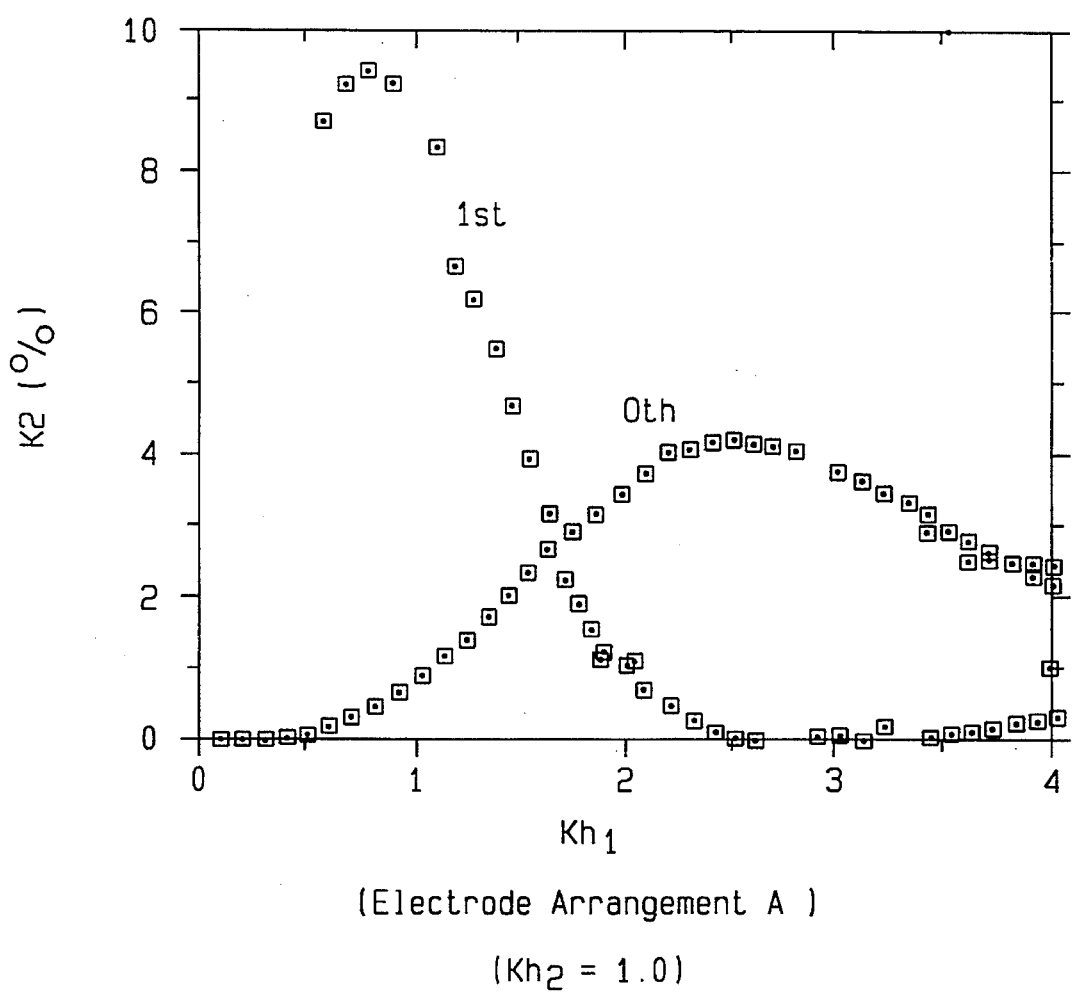
FIG. 13 is a graph showing a relationship between the electro-mechanical coupling coefficient $K^2$ and the parameter $kh_1$ in a SAW device having the above-mentioned "Layer Structure 2" and the above-mentioned "Electrode Arrangement A" (the parameter $kh_2=1.0$).
Figure 14:
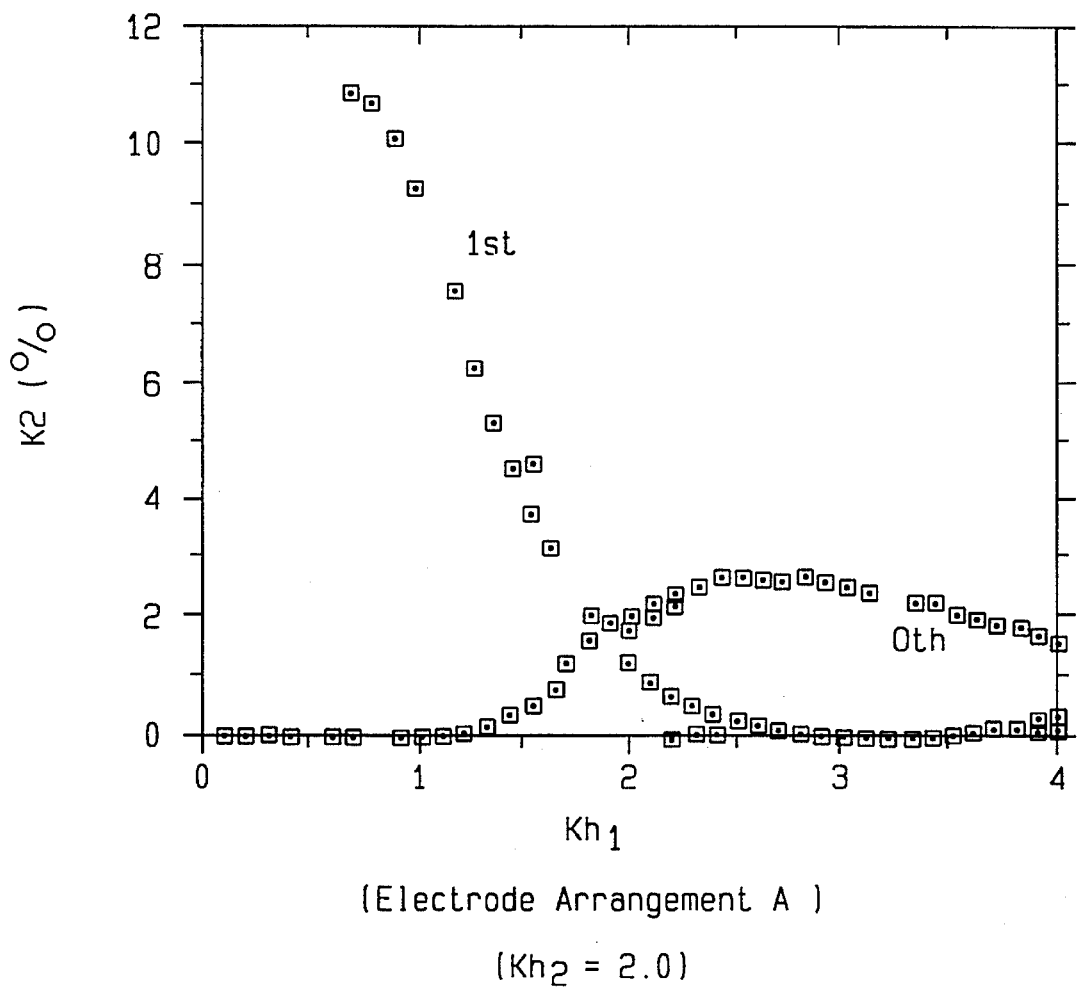
FIG. 14 is a graph showing a relationship between the electro-mechanical coupling coefficient $K^2$ and the parameter $kh_1$ in a SAW device having the above-mentioned "Layer Structure 2" and the above-mentioned "Electrode Arrangement A" (the parameter $kh_2=2.0$).
Figure 15:
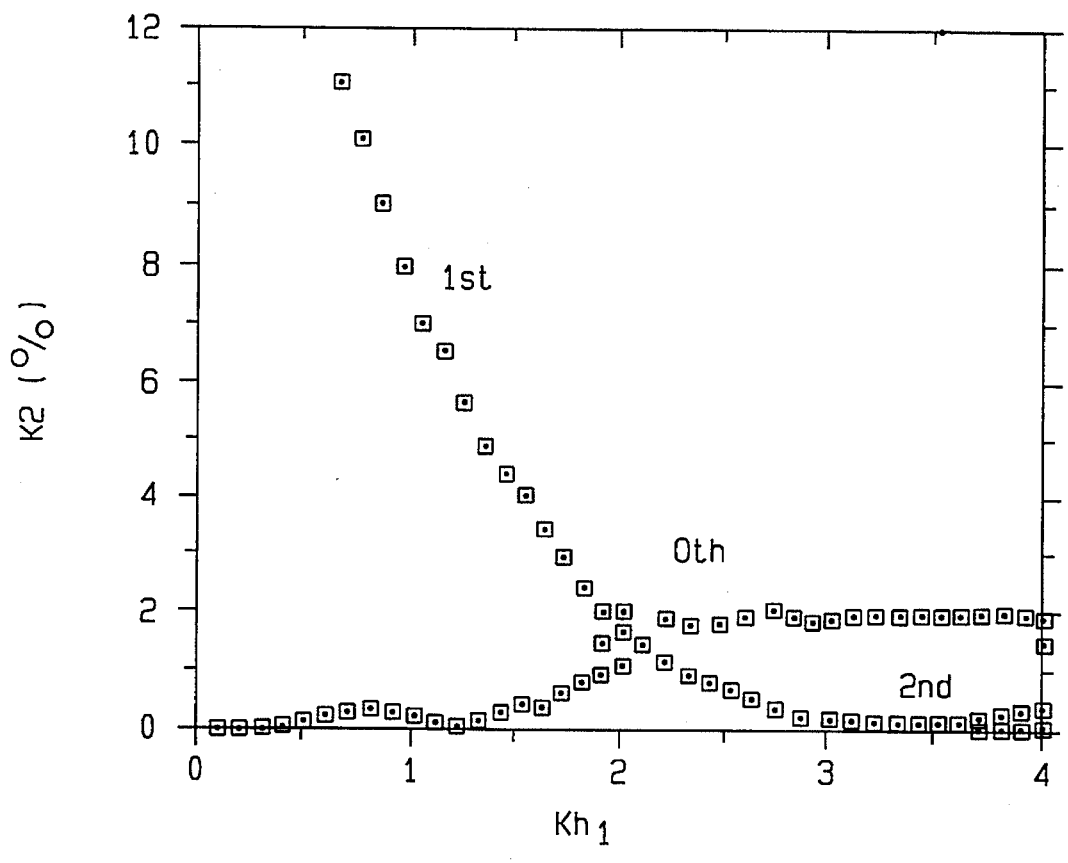
FIG. 15 is a graph showing a relationship between the electro-mechanical coupling coefficient $K^2$ and the parameter $kh_1$ in a SAW device having the above-mentioned "Layer Structure 2" and the above-mentioned "Electrode Arrangement A" (the parameter $kh_2=3.0$).
Figure 16:
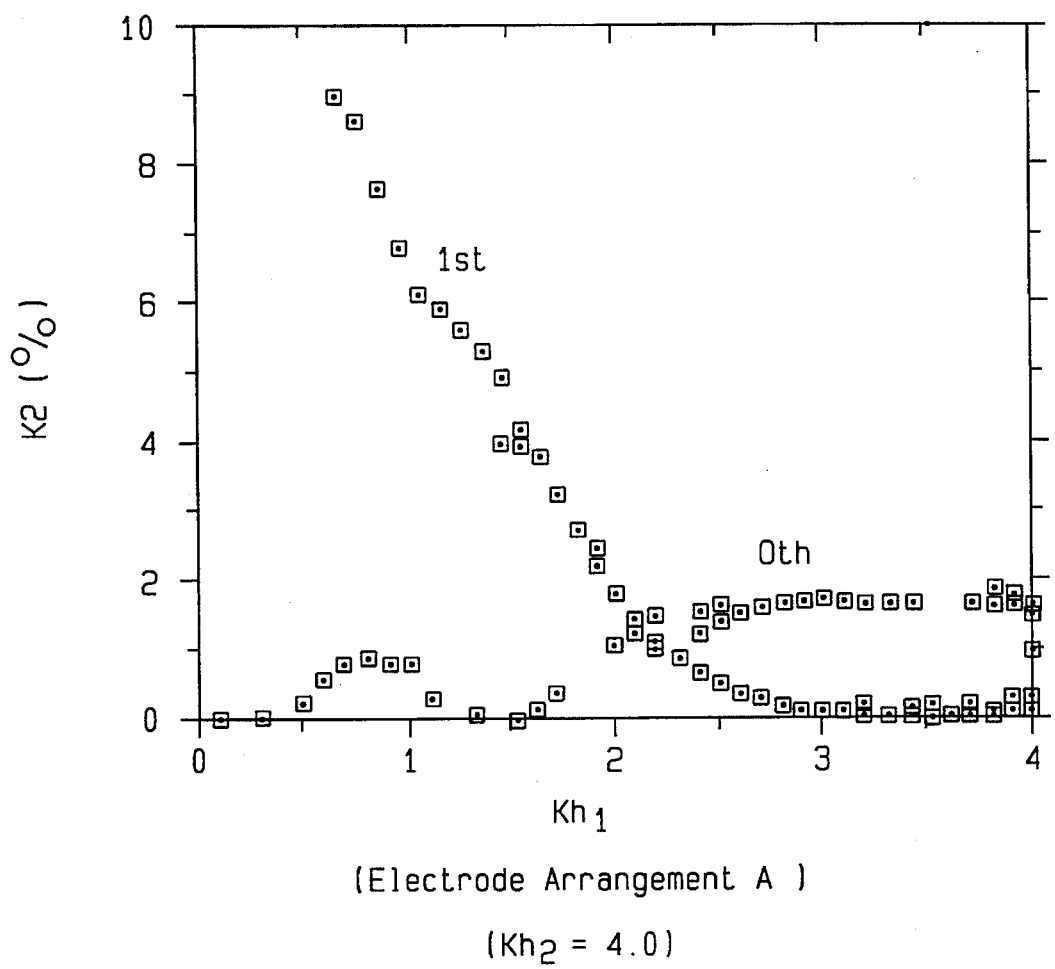
FIG. 16 is a graph showing a relationship between the electro-mechanical coupling coefficient $K^2$ and the parameter $kh_1$ in a SAW device having the above-mentioned "Layer Structure 2" and the above-mentioned "Electrode Arrangement A" (the parameter $kh_2=4.0$).

With respect to the SAW devices fabricated above (FIG. 5, Electrode Arrangement A), the resultant relationships (dependency) between the electro-mechanical coupling coefficient $K_2$ and the parameter $kh_1$ are shown in each of the graphs of FIG. 13 ($kh_2$=1.0), FIG. 14 ($kh_2$=2.0), FIG. 15 ($kh_2$=3.0) and FIG. 16 ($kh_2$=4.0). It was also found that SAW devices in the case of $kh_2$=6.0 or 8.0 showed a similar tendency as that described above (i.e., tendency as shown in FIGS. 13–16).

Figure 17:
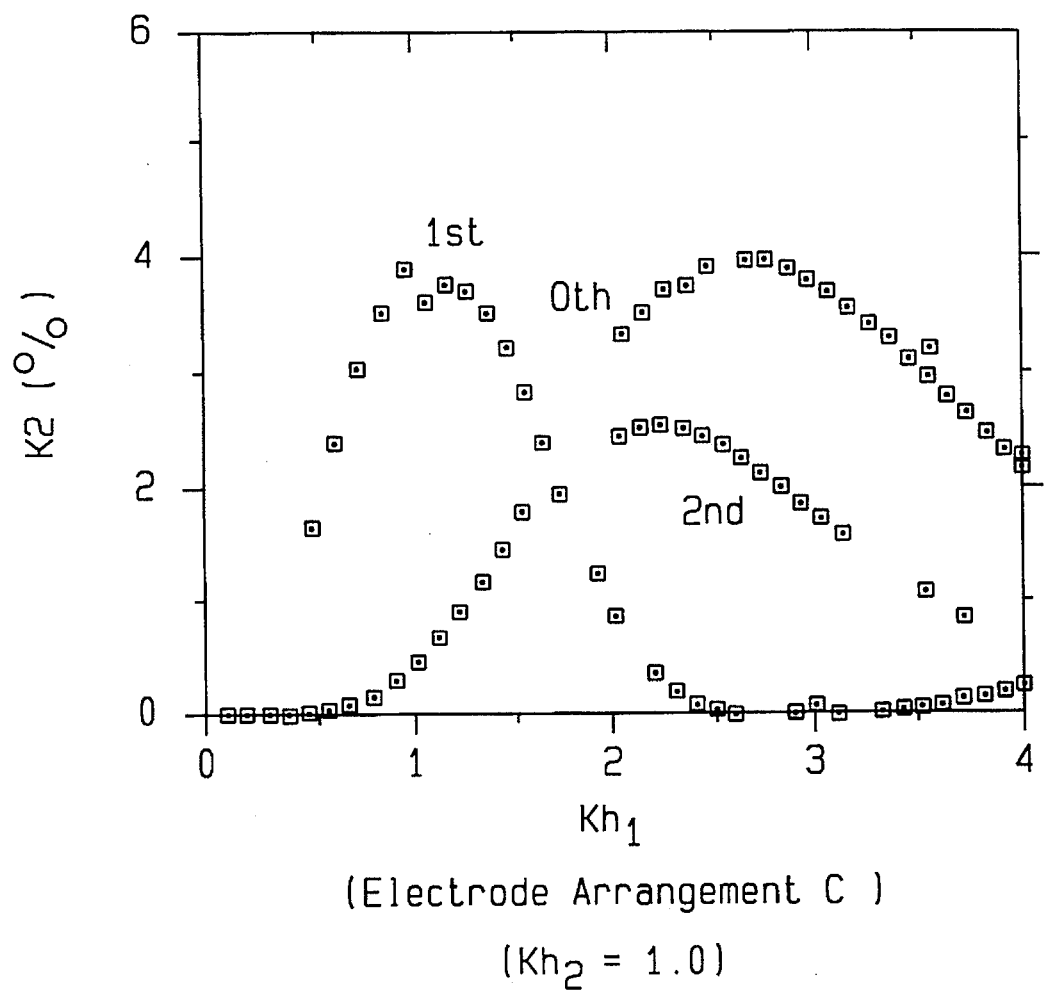
FIG. 17 is a graph showing a relationship between the electro-mechanical coupling coefficient $K^2$ and the parameter $kh_1$ in a SAW device having the above-mentioned "Layer Structure 2" and the above-mentioned "Electrode Arrangement C" (the parameter $kh_2=1.0$).
Figure 18:
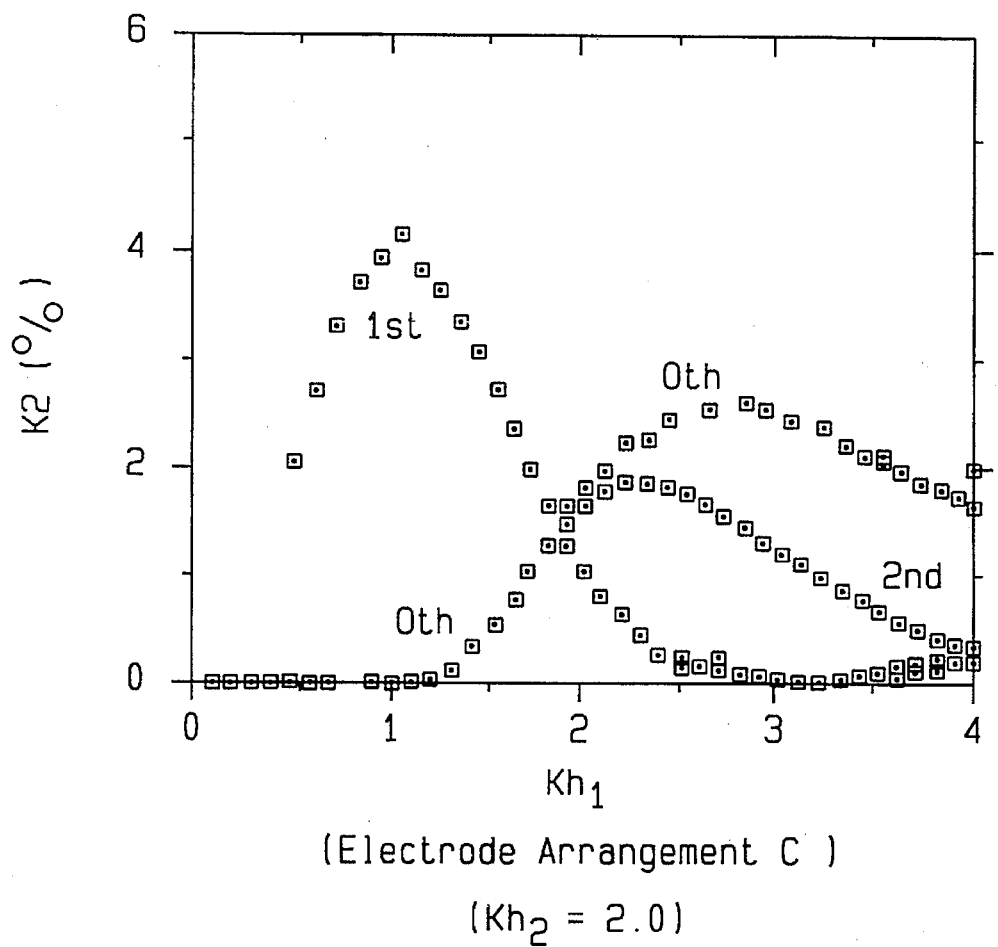
FIG. 18 is a graph showing a relationship between the electro-mechanical coupling coefficient $K^2$ and the parameter $kh_1$ in a SAW device having the above-mentioned "Layer Structure 2" and the above-mentioned "Electrode Arrangement C" (the parameter $kh_2=2.0$).
Figure 19:
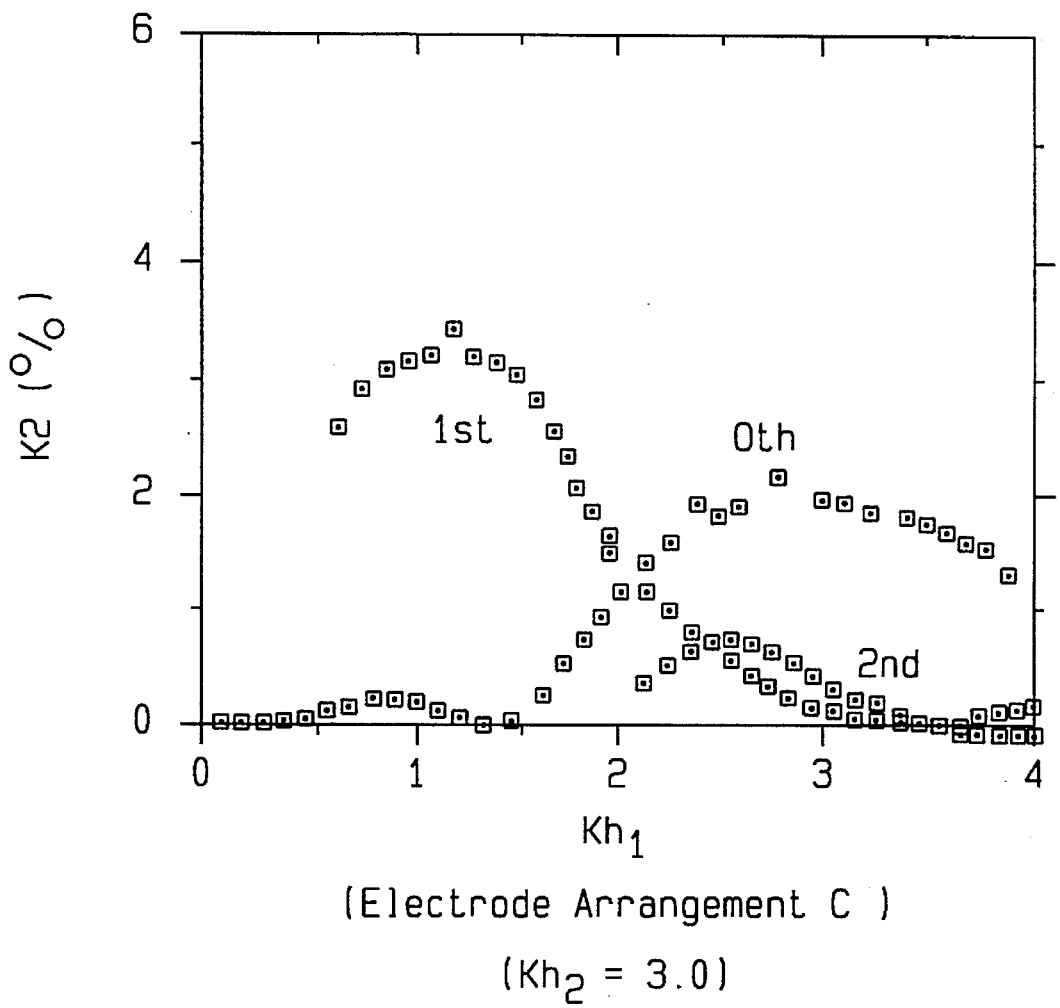
FIG. 19 is a graph showing a relationship between the electro-mechanical coupling coefficient $K^2$ and the parameter $kh_1$ in a SAW device having the above-mentioned "Layer Structure 2" and the above-mentioned "Electrode Arrangement C" (the parameter $kh_2=3.0$).
Figure 20:
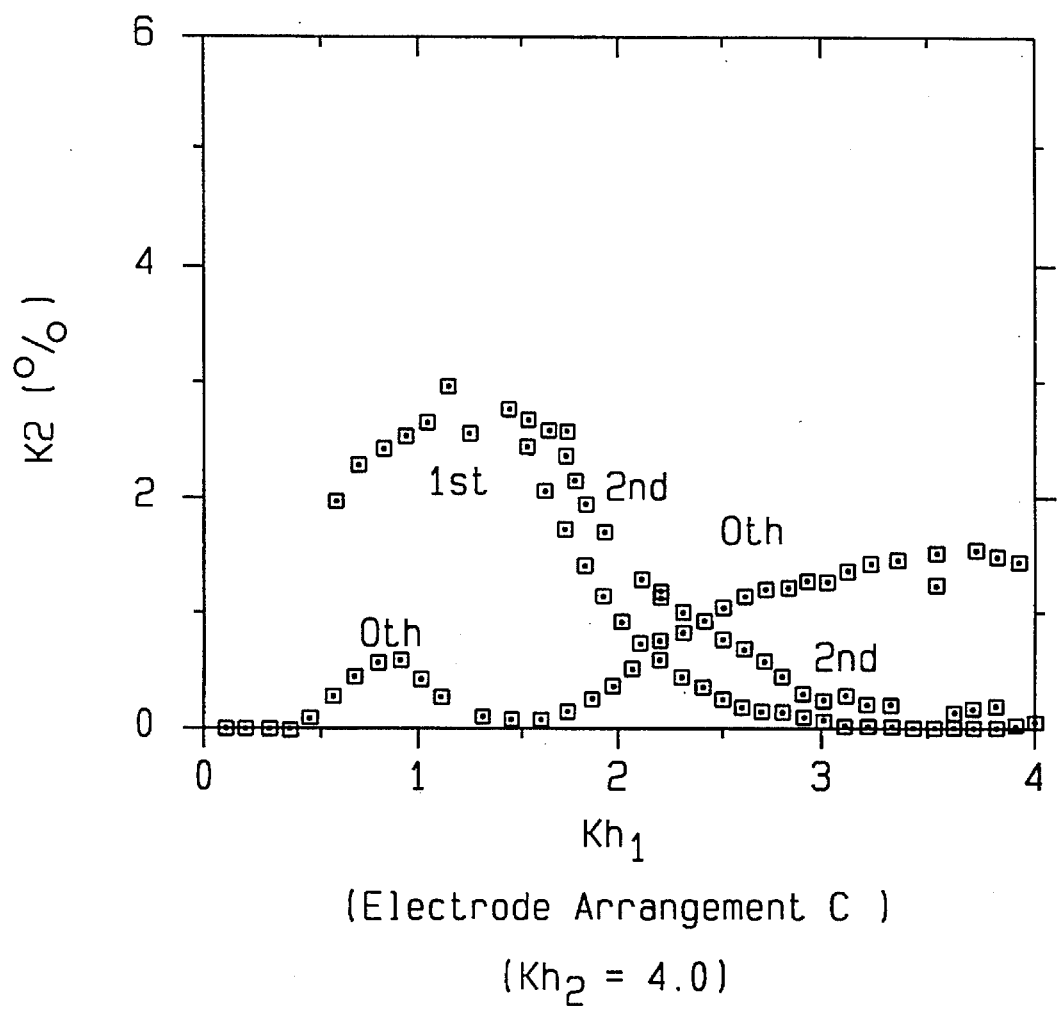
FIG. 20 is a graph showing a relationship between the electro-mechanical coupling coefficient $K^2$ and the parameter $kh_1$ in a SAW device having the above-mentioned "Layer Structure 2" and the above-mentioned "Electrode Arrangement C" (the parameter $kh_2=4.0$).

With respect to the SAW devices fabricated above (FIG. 6, Electrode Arrangement C), the resultant relationships (dependency) between the electro-mechanical coupling coefficient $K_2$ and the parameter $kh_1$ are shown in each of the graphs of FIG. 17 ($kh_2$=1.0), FIG. 18 ($kh_2$=2.0), FIG. 19 ($kh_2$=3.0) and FIG. 20 ($kh_2$=4.0). It was also found that SAW devices in the case of $kh_2$=6.0 or 8.0 showed a similar tendency as that described above (i.e., tendency as shown in FIGS. 17–20).

Figure 21:
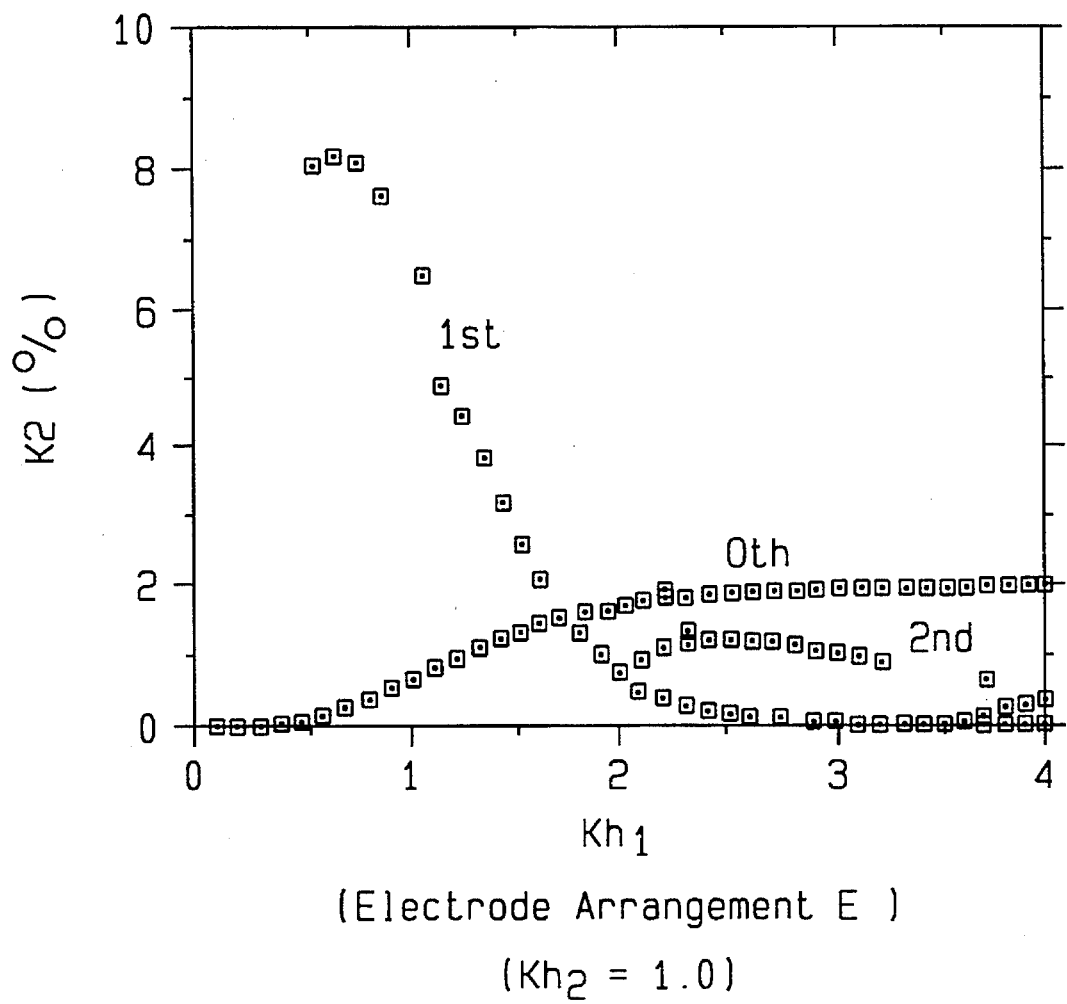
FIG. 21 is a graph showing a relationship between the electro-mechanical coupling coefficient $K^2$ and the parameter $kh_1$ in a SAW device having the above-mentioned "Layer Structure 2" and the above-mentioned "Electrode Arrangement E" (the parameter $kh_2=1.0$).
Figure 22:
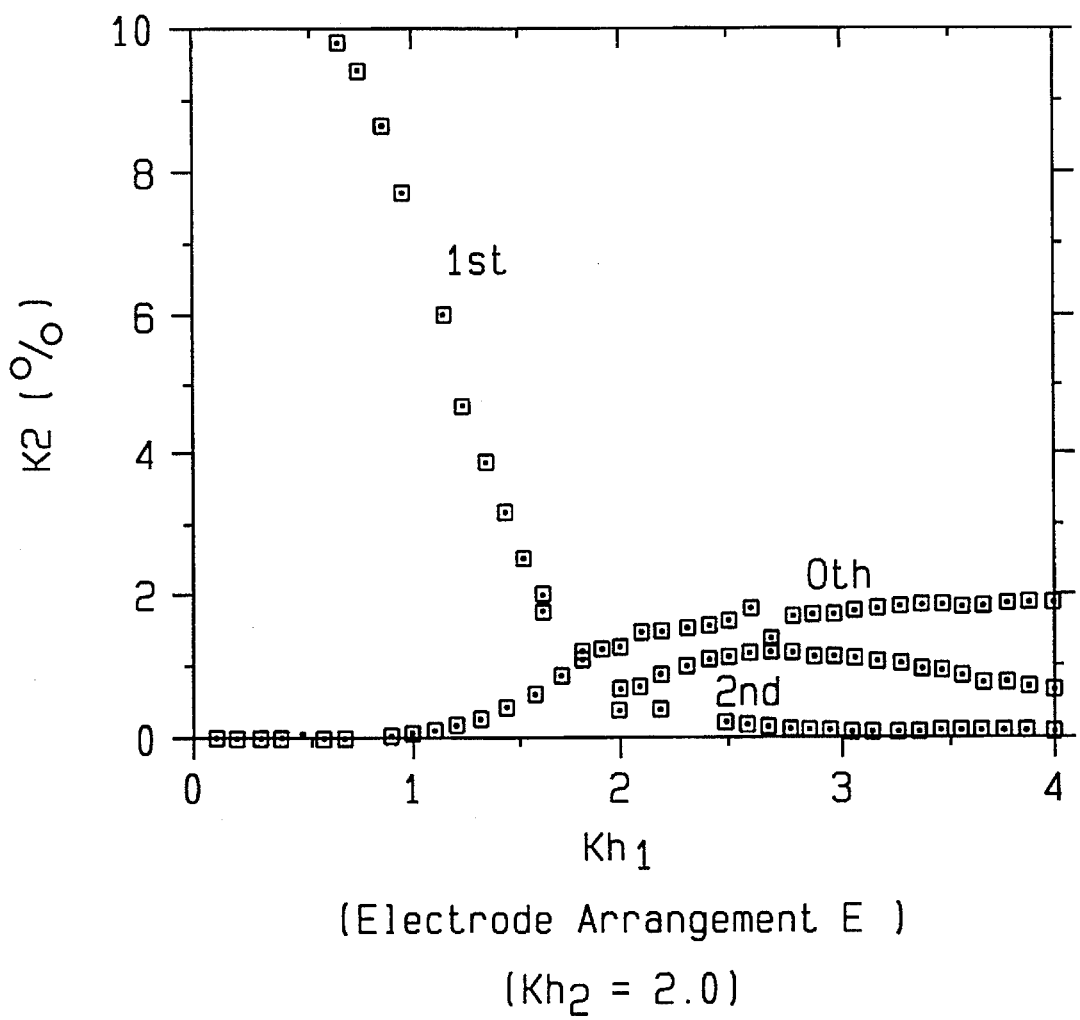
FIG. 22 is a graph showing a relationship between the electro-mechanical coupling coefficient $K^2$ and the parameter $kh_1$ in a SAW device having the above-mentioned "Layer Structure 2" and the above-mentioned "Electrode Arrangement E" (the parameter $kh_2=2.0$).
Figure 23:
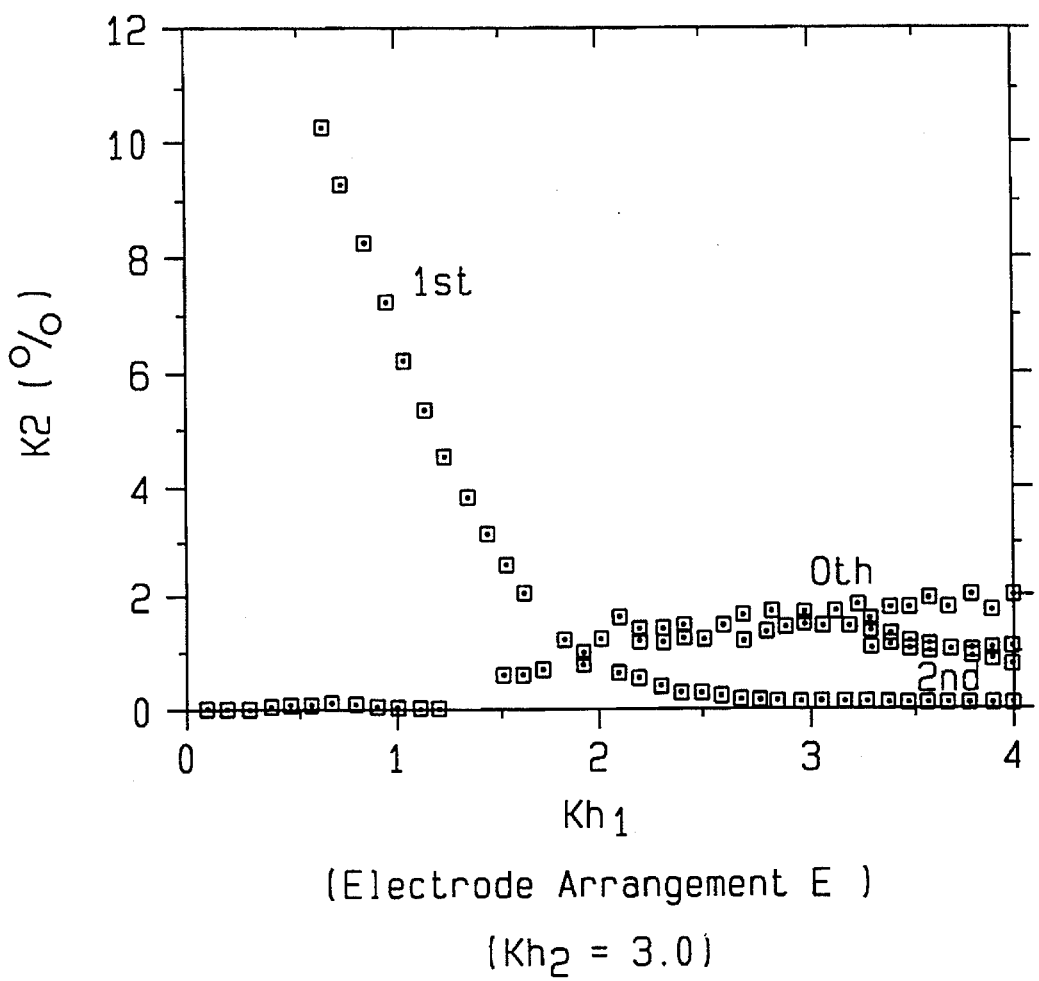
FIG. 23 is a graph showing a relationship between the electro-mechanical coupling coefficient $K^2$ and the parameter $kh_1$ in a SAW device having the above-mentioned "Layer Structure 2" and the above-mentioned "Electrode Arrangement E" (the parameter $kh_2=3.0$).
Figure 24:
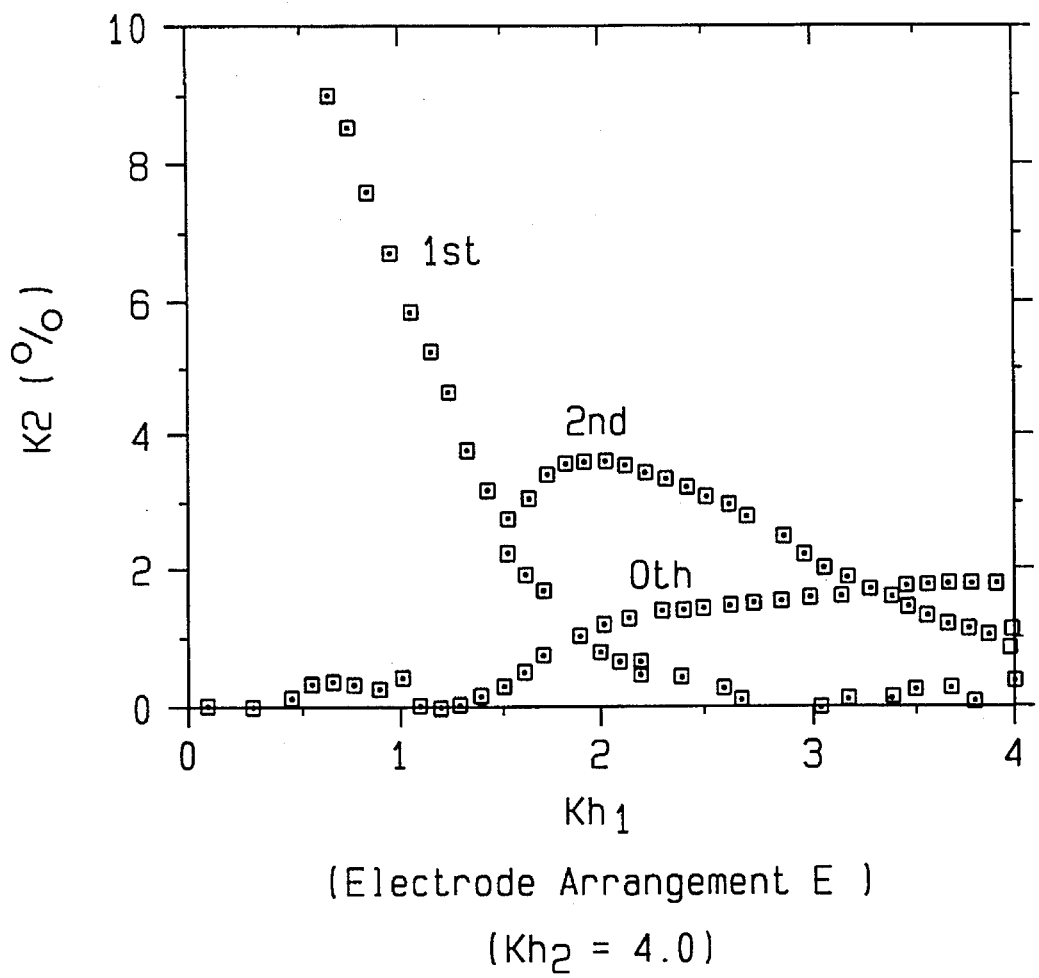
FIG. 24 is a graph showing a relationship between the electro-mechanical coupling coefficient $K^2$ and the parameter $kh_1$ in a SAW device having the above-mentioned "Layer Structure 2" and the above-mentioned "Electrode Arrangement E" (the parameter $kh_2=4.0$).

With respect to the SAW devices fabricated above (FIG. 7, Electrode Arrangement E), the resultant relationships (dependency) between the electro-mechanical coupling coefficient $K_2$ and the parameter $kh_1$ are shown in each of the graphs of FIG. 21 ($kh_2$=1.0), FIG. 22 ($kh_2$=2.0), FIG. 23 ($kh_2$=3.0) and FIG. 24 ($kh_2$=4.0). It was also found that SAW devices in the case of $kh_2$=6.0 or 8.0 showed a similar tendency as that described above (i.e., tendency as shown in FIGS. 21–24).

Figure 25:
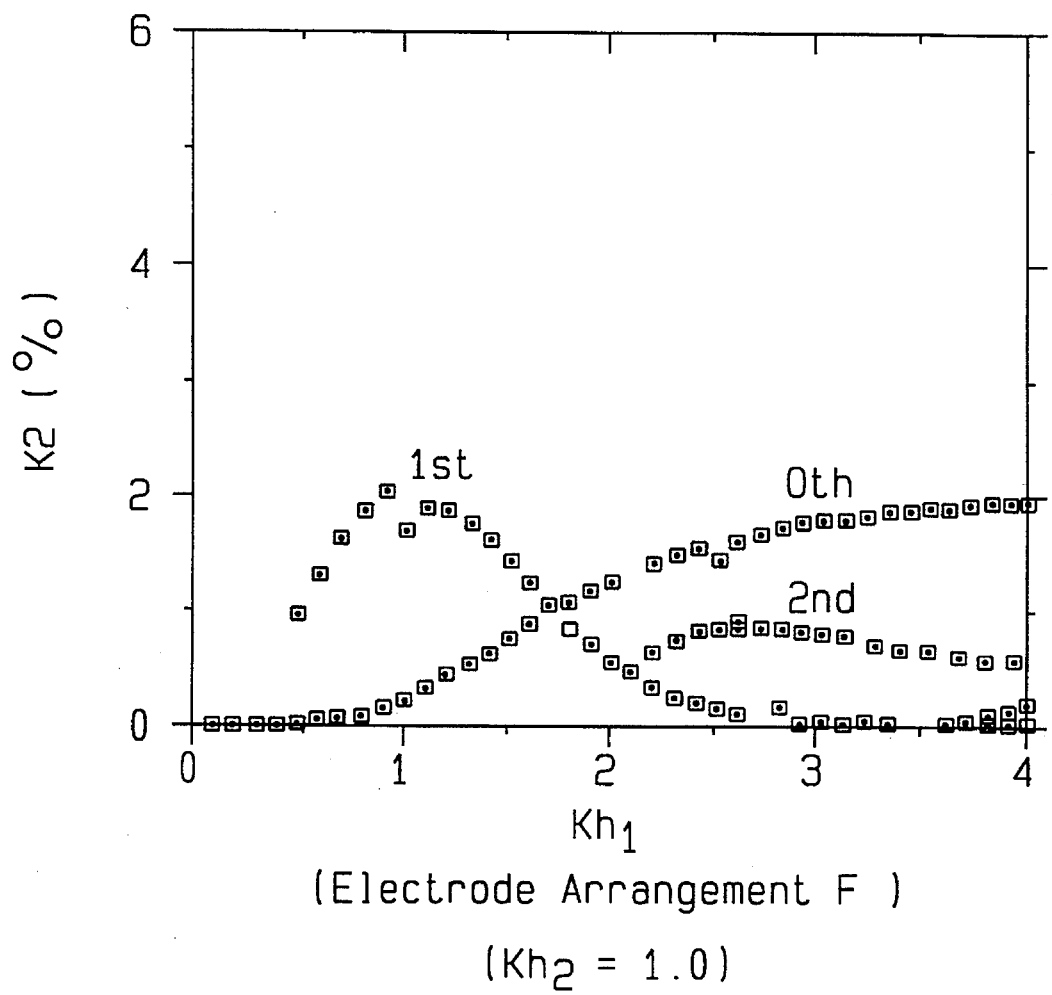
FIG. 25 is a graph showing a relationship between the electro-mechanical coupling coefficient $K^2$ and the parameter $kh_1$ in a SAW device having the above-mentioned "Layer Structure 2" and the above-mentioned "Electrode Arrangement F" (the parameter $kh_2=1.0$).
Figure 26:
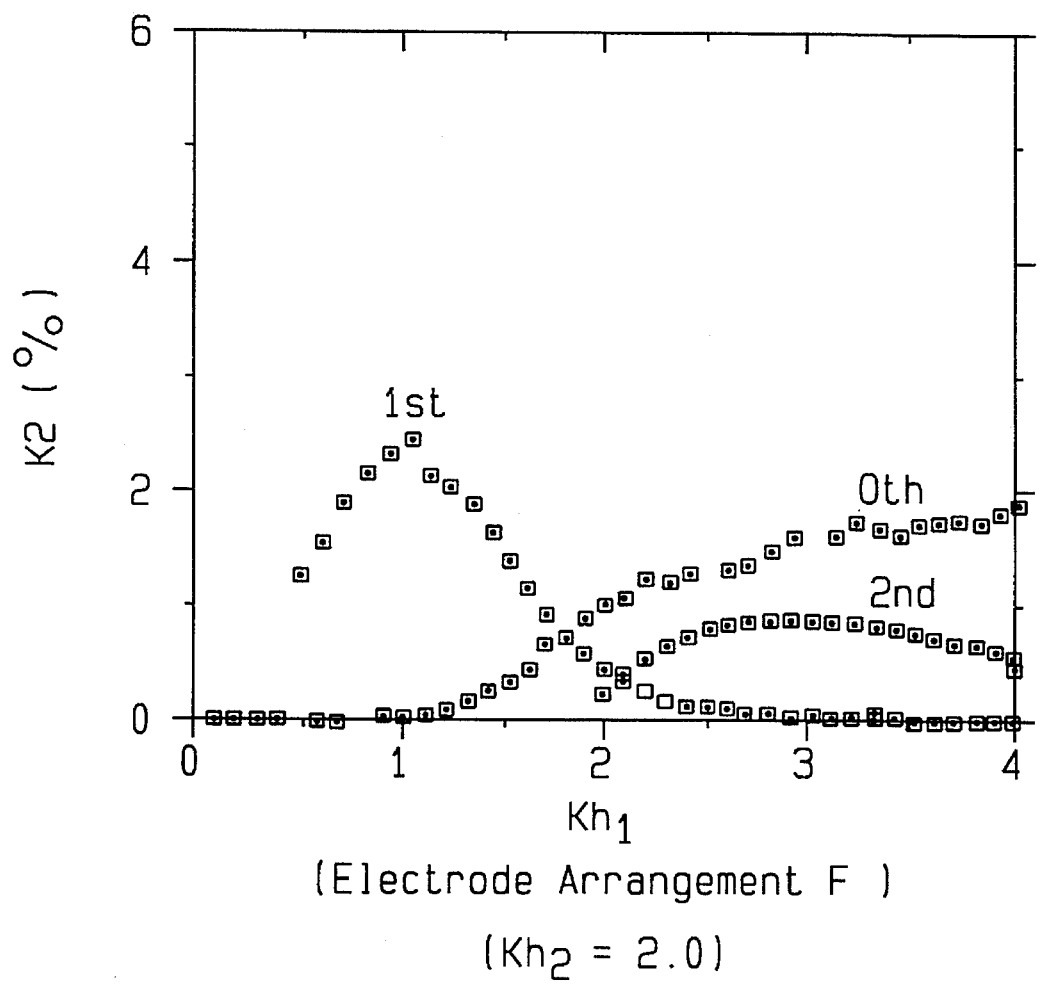
FIG. 26 is a graph showing a relationship between the electro-mechanical coupling coefficient $K^2$ and the parameter $kh_1$ in a SAW device having the above-mentioned "Layer Structure 2" and the above-mentioned "Electrode Arrangement F" ( the parameter $kh_2=2.0$).
Figure 27:
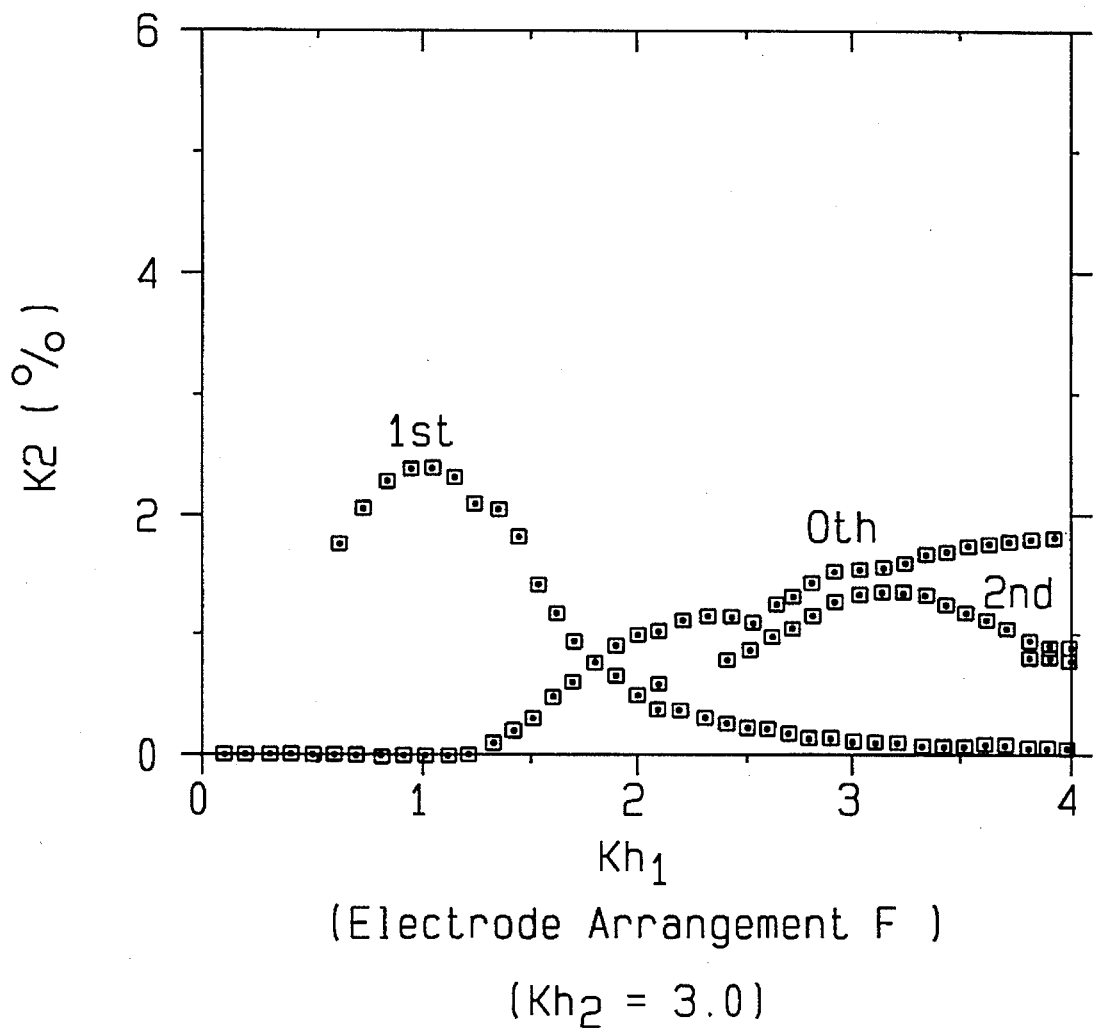
FIG. 27 is a graph showing a relationship between the electro-mechanical coupling coefficient $K^2$ and the parameter $kh_1$ in a SAW device having the above-mentioned "Layer Structure 2" and the above-mentioned "Electrode Arrangement F" ( the parameter $kh_2=3.0$).
Figure 28:
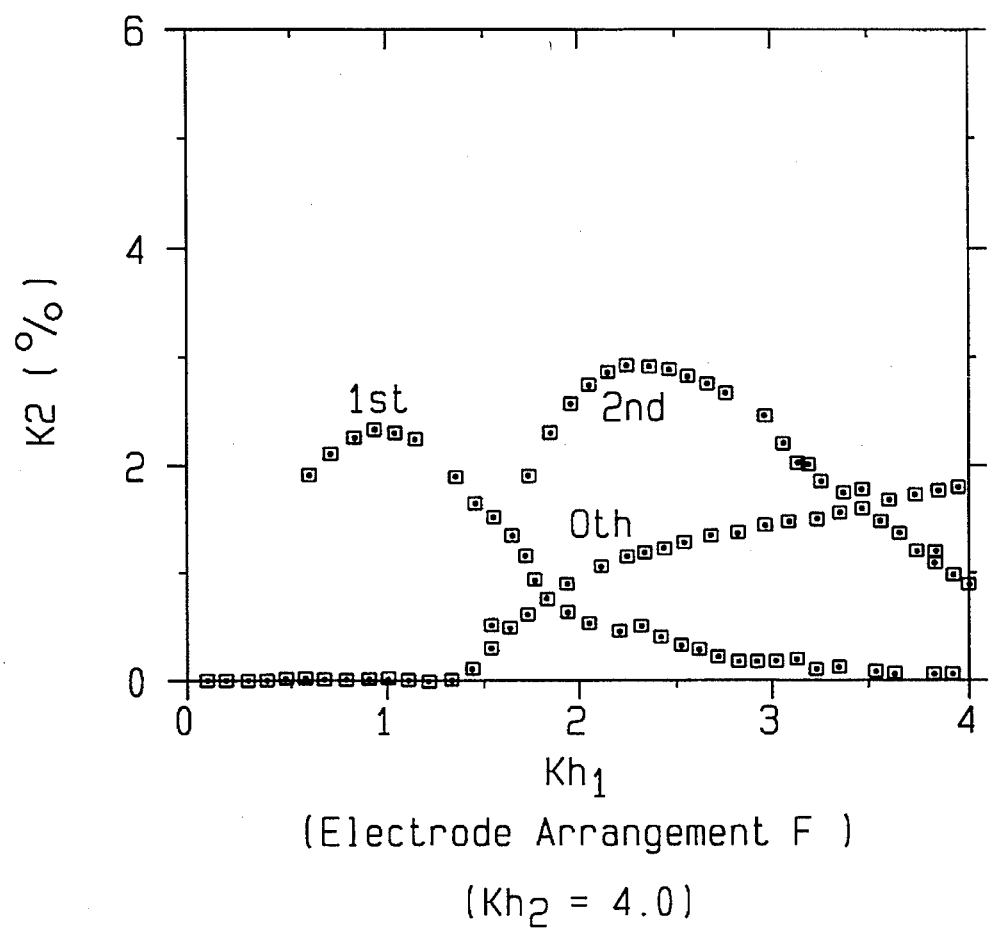
FIG. 28 is a graph showing a relationship between the electro-mechanical coupling coefficient $K^2$ and the parameter $kh_1$ in a SAW device having the above-mentioned "Layer Structure 2" and the above-mentioned "Electrode Arrangement F" (the parameter $kh_2=4.0$).

With respect to the SAW devices fabricated above (FIG. 8, Electrode Arrangement F), the resultant relationships (dependency) between the electro-mechanical coupling coefficient $K_2$ and the parameter $kh_1$ are shown in each of the graphs of FIG. 25 ($kh_2$=1.0), FIG. 26 ($kh_2$=2.0), FIG. 27 ($kh_2$=3.0) and FIG. 28 ($kh_2$=4.0). It was also found that SAW devices in the case of $kh_2$=6.0 or 8.0 showed a similar tendency as that described above (i.e., tendency as shown in FIGS. 25–28).

As described above, the SAW devices of this Example 1 achieved a good propagation velocity V of SAW (V≧7000 m/s) and a good electro-mechanical coupling coefficient $K_2$ ($K_2$≧1%) in the case of any of various LiNbO$_3$ layer thicknesses, diamond layer thicknesses, and electrode arrangements.

EXAMPLE 2

On a (100) surface of monocrystalline diamond (natural type, Type-Ia), an IDT (planer shape: double-type electrode as shown in FIG. 2, electrode element width d=1 μm, pitch=8 μm) having a thickness of 400 Å was formed by use of Al, and thereafter an LiNbO$_3$ film (film thickness: 0.13–5.1 μm, 40 kinds) was formed by using an RF magnetron sputtering method in the same manner as in Example 1, thereby to fabricate SAW device samples having a layer structure (Layer Structure 1) as shown in FIG. 3, and an electrode arrangement (Electrode Arrangement A) as shown in FIG. 5 (number of electrode element pairs of input IDT: 30, number of electrode element pairs of output IDT: 30, distance between centers of input and output electrodes: 400 μm). All of the thus formed LiNbO$_3$ films were C-axis-oriented films, and the σ value of the X-ray rocking curve of each LiNbO$_3$ film was 2°–3°.

On the resultant SAW device (Electrode Arrangement A) fabricated above, a short-circuiting electrode having a thickness of 100 Å was further formed by use of Al, thereby to fabricate SAW devices having a layer structure as shown in FIG. 3 (Layer Structure 1) and an electrode arrangement as shown in FIG. 6 (Electrode Arrangement C).

SAW devices having a layer structure as shown in FIG. 3 (Layer Structure 1) and an electrode arrangement as shown in FIG. 7 (Electrode Arrangement E), and SAW devices having a layer structure as shown in FIG. 3 (Layer Structure 1) and an electrode arrangement as shown in FIG. 8 (Electrode Arrangement F) were fabricated in the same manner as described above, except for changing the order of the respective layer formation.

With respect to each of the SAW devices as fabricated above, radio frequency was applied to the input IDT to generate SAW in the same manner as in Example 1. At this time, the propagation velocities V (m/s) of the thus generated SAWs of respective modes, the electromechanical coupling coefficient ($K^2$), and the thickness $t_1$ (μm) of the LiNbO$_3$ layer were determined in the same manner as in Example 1.

On the basis of the thus obtained data, a parameter of $kh_1=2\pi(t_1/\lambda)$ was determined with respect to each of the SAW devices having a layer structure (Layer Structure 1) shown in FIG. 3, and an electrode arrangement (any of Electrode Arrangements A, C, E and F) shown in FIGS. 5–8 ($\lambda=8$ μm).

Figure 29:
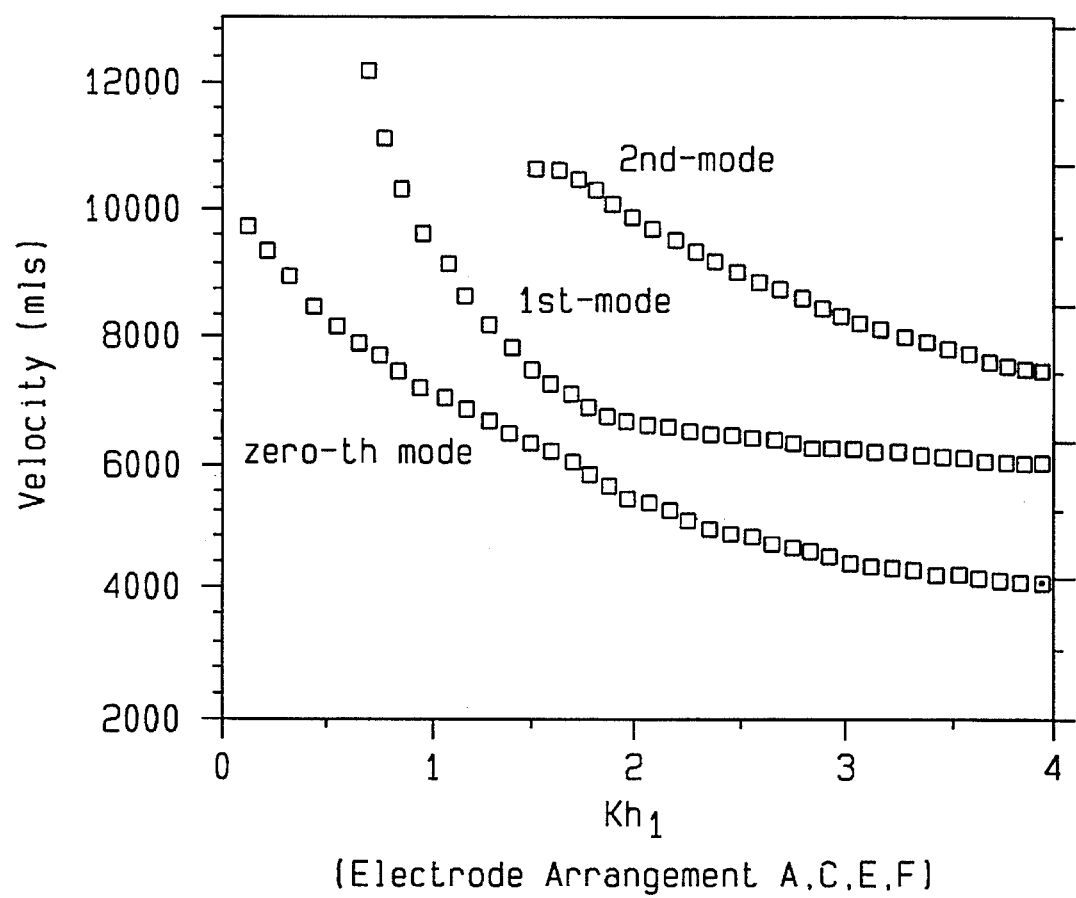
FIG. 29 is a graph showing a relationship between the propagation velocity V of SAW and the parameter $kh_1$ in a SAW device having the above-mentioned "Layer Structure 1" and the above-mentioned "Electrode Arrangement A, C, E or F".

The resultant relationships (dependency) between the propagation velocity V and the parameter $kh_1=2\pi(t_1/\lambda)$ which had been determined in the above-described manner are shown in the graph of FIG. 29.

Figure 30:
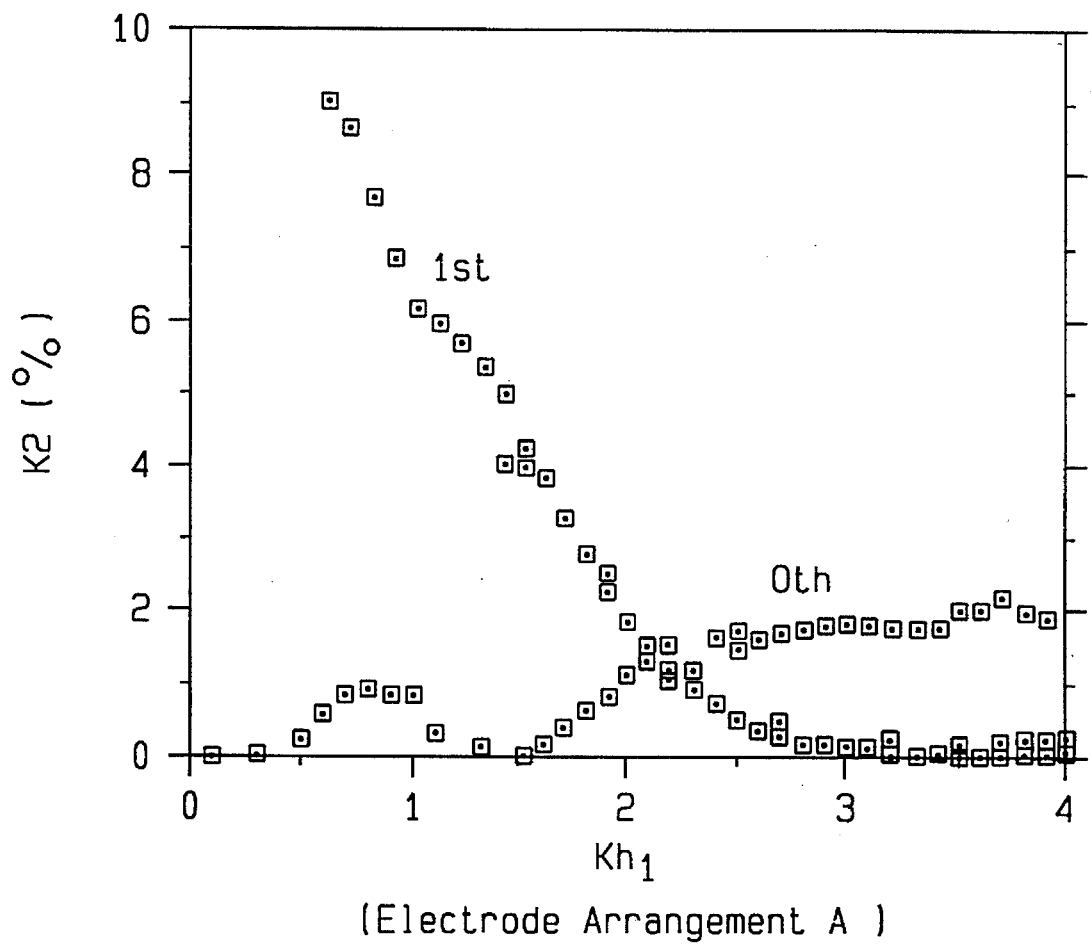
FIG. 30 is a graph showing a relationship between the electro-mechanical coupling coefficient $K^2$ and the parameter $kh_1$ in a SAW device having the above-mentioned "Layer Structure 1" and the above-mentioned "Electrode Arrangement A".
Figure 31:
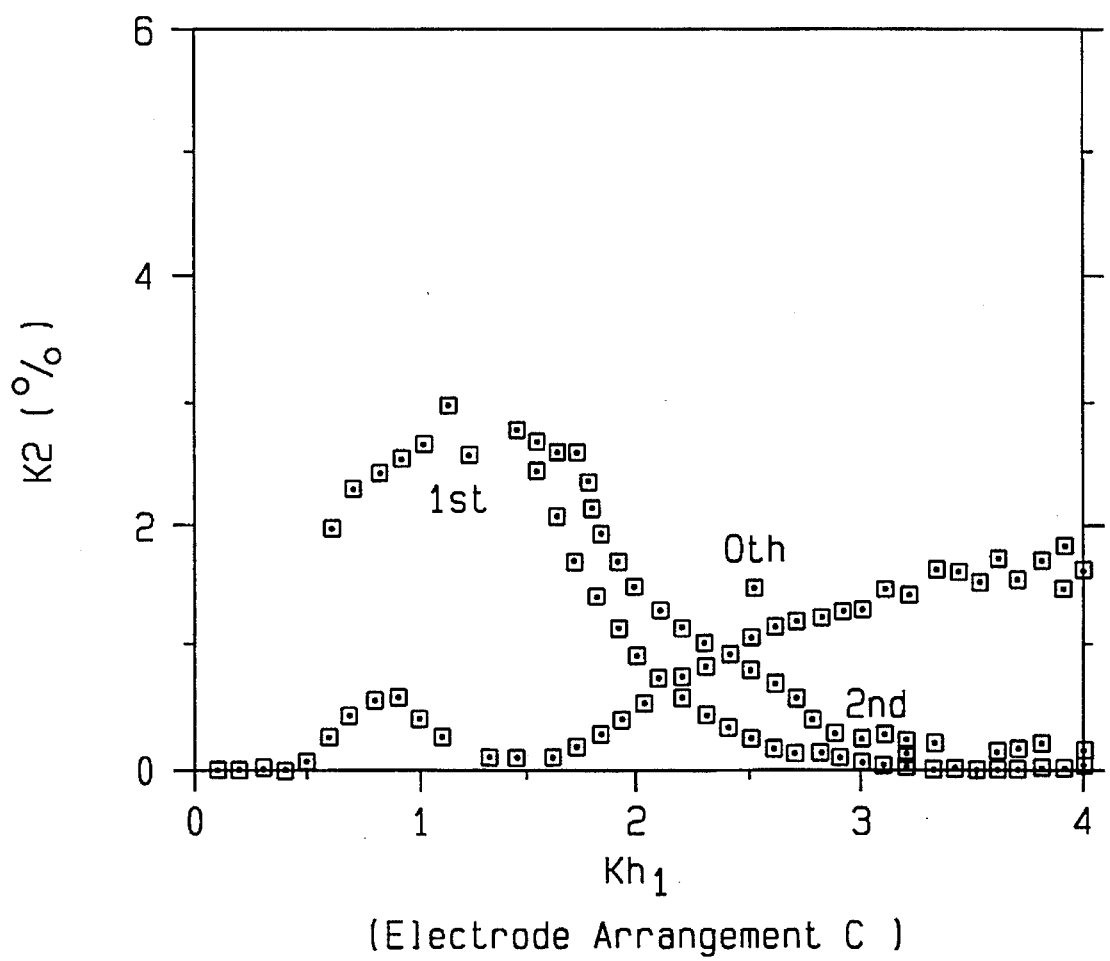
FIG. 31 is a graph showing a relationship between the electro-mechanical coupling coefficient $K^2$ and the parameter $kh_1$ in a SAW device having the above-mentioned "Layer Structure 1" and the above-mentioned "Electrode Arrangement C".
Figure 32:
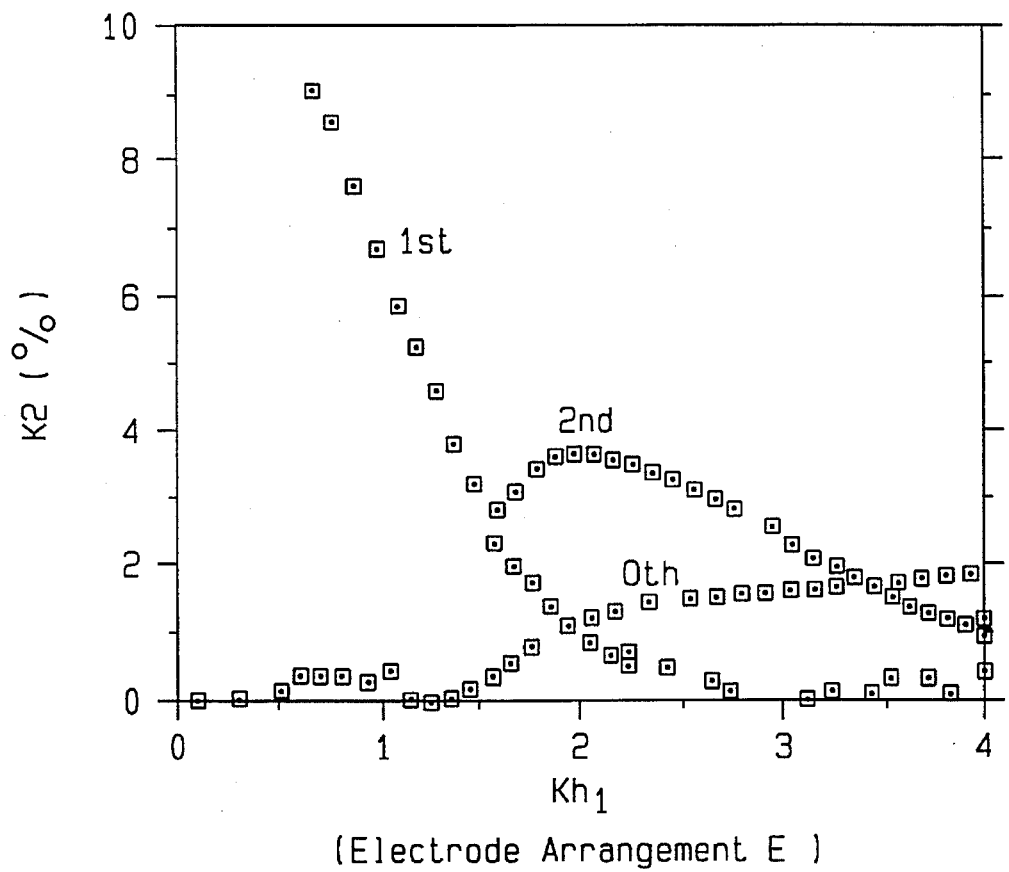
FIG. 32 is a graph showing a relationship between the electro-mechanical coupling coefficient $K^2$ and the parameter $kh_1$ in a SAW device having the above-mentioned "Layer Structure 1" and the above-mentioned "Electrode Arrangement E".
Figure 33:
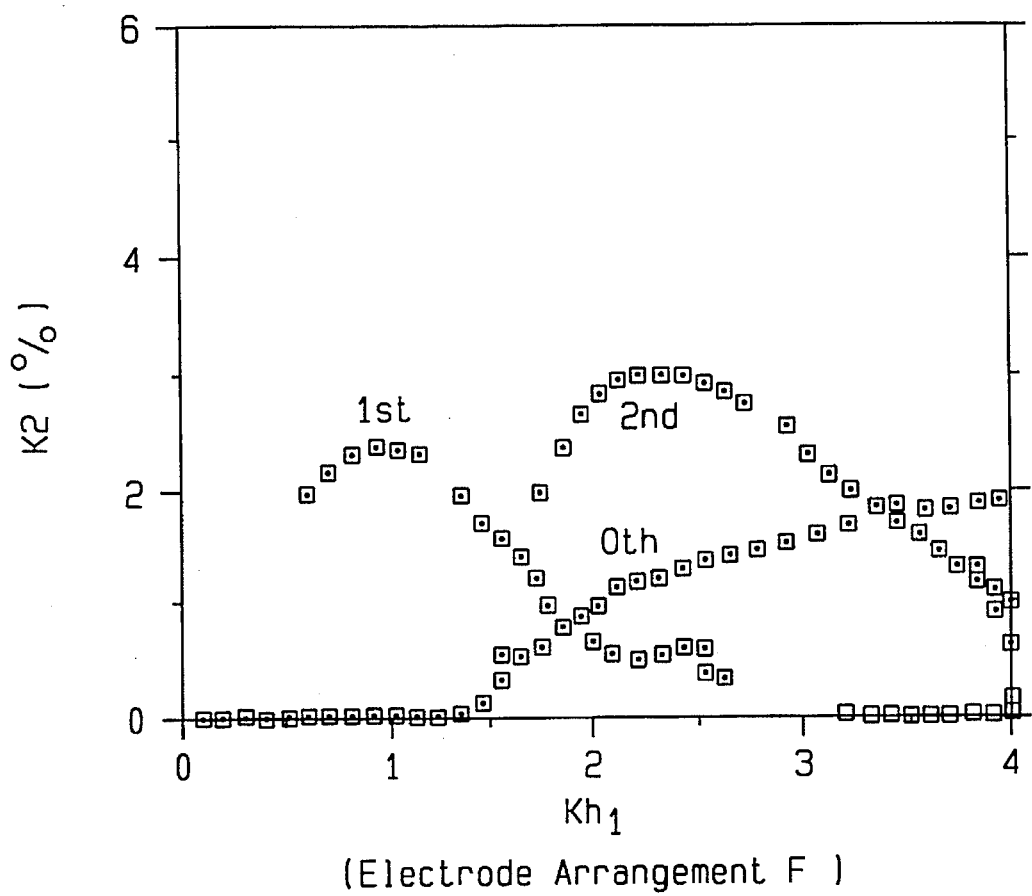
FIG. 33 is a graph showing a relationship between the electro-mechanical coupling coefficient $K^2$ and the parameter $kh_1$ in a SAW device having the above-mentioned "Layer Structure 1" and the above-mentioned "Electrode Arrangement F".

With respect to the SAW devices fabricated above (Electrode Arrangement A, C, E and F), the resultant relationships (dependency) between the electro-mechanical coupling coefficient $K_2$ and the parameter $kh_1$ are shown in each of the graphs of FIG. 30 (Electrode Arrangement A), FIG. 31 (Electrode Arrangement C), FIG. 32 (Electrode Arrangement E) and FIG. 33 (Electrode Arrangement F).

As described above, the SAW devices of this Example 2 achieved a good propagation velocity V of SAW ($V \geq 7000$ m/s) and a good electro-mechanical coupling coefficient $K_2$ ($K_2 \geq 1\%$) in the case of any of various electrode arrangements.

As described hereinabove, according to the present invention, there is provided a SAW device which comprises at least, diamond, an $LiNbO_3$ layer disposed on the diamond, and an IDT provided so as to contact the $LiNbO_3$ layer; and utilizes SAW of an "n-th" mode (n=0, 1 or 2) having a wavelength of $\lambda_n$ (μm), wherein a parameter of $kh_1=2\pi(t_1/\lambda_n)$ is in a specific range provided that the thickness of the $LiNbO_3$ layer is denoted by $t_1$ (μm).

The SAW device according to the present invention having the above structure may provide a good SAW propagation velocity V satisfying a relationship of $V \geq 7000$ m/s and a good electro-mechanical coupling coefficient $K^2$ satisfying a relationship of $K^2 \geq 2\%$.

The basic foreign Applications filed on May 10, 1994, No. 096534/1994 (i.e., Hei 6-096534); and filed on Sep. 2, 1994, No. 210113/1994 (i.e., Hei 6- 210113) in JAPAN are hereby incorporated by reference.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A surface acoustic wave device, comprising: at least, diamond, an interdigital transducer disposed on the diamond, and a polycrystalline C-axis-oriented $LiNbO_3$ layer disposed on the interdigital transducer; the surface acoustic wave device utilizing surface acoustic wave of zero-th mode having a wavelength of $\lambda$ (μm), and having a parameter of $kh_1=2\pi(t_1/\lambda)$ satisfying a relationship of $0.7 \leq kh_1 \leq 1.0$ provided that the thickness of the $LiNbO_3$ layer is $t_1$ (μm).

2. A surface acoustic wave device according to claim 1, wherein the diamond comprises a diamond layer disposed on a base material, the surface acoustic wave device having a parameter of $kh_2=2\pi(t_2/\lambda)$ satisfying a relationship of $4 \leq kh_2$ provided that the thickness of the diamond layer is $t_2$ (μm).

3. A surface acoustic wave device, comprising: at least, diamond, an interdigital transducer disposed on the diamond, and a polycrystalline C-axis-oriented $LiNbO_3$ layer disposed on the interdigital transducer; the surface acoustic wave device utilizing surface acoustic wave of 1st-mode having a wavelength of $\lambda$ (μm), and having a parameter of $kh_1=2\pi(t_1/\lambda)$ satisfying a relationship of $0.5 \leq kh_1 \leq 1.5$ provided that the thickness of the $LiNbO_3$ layer is $t_1$ (μm).

4. A surface acoustic wave device according to claim 3, wherein the parameter of $kh_1=2\pi(t_1/\lambda)$ satisfies a relationship of $0.5 \leq kh_1 \leq 1.0$.

5. A surface acoustic wave device according to claim 4, wherein the diamond comprises a diamond layer disposed on a base material, the surface acoustic wave device having a parameter of $kh_2=2\pi(t_2/\lambda)$ satisfying a relationship of $2 \leq kh_2$ provided that the thickness of the diamond layer is $t_2$ (μm).

6. A surface acoustic wave device according to claim 5, wherein the parameter of $kh_1=2\pi(t_1/\lambda)$ satisfies a relationship of $0.5 \leq kh_1 \leq 0.8$, and the parameter of $kh_2=2\pi(t_2/\lambda)$ satisfies a relationship of $2 \leq kh_2 \leq 3$.

7. A surface acoustic wave device, comprising: at least, diamond, a polycrystalline C-axis-oriented $LiNbO_3$ layer disposed on the diamond, and an interdigital transducer disposed on the $LiNbO_3$ layer; the surface acoustic wave device utilizing surface acoustic wave of 1st-mode having a wavelength of $\lambda$ (μm), and having a parameter of $kh_1=2\pi(t_1/\lambda)$ satisfying a relationship of $0.5 \leq kh_1 \leq 1.5$ provided that the thickness of the $LiNbO_3$ layer is $t_1$ (μm).

8. A surface acoustic wave device according to claim 7, wherein the parameter of $kh_1=2\pi(t_1/\lambda)$ satisfies a relationship of $0.5 \leq kh_1 \leq 1.0$.

9. A surface acoustic wave device according to claim 8, wherein the diamond comprises a diamond layer disposed on a base material, the surface acoustic wave device having a parameter of $kh_2=2\pi(t_2/\lambda)$ satisfying a relationship of $2 \leq kh_2$ provided that the thickness of the diamond layer is $t_2$ (μm).

10. A surface acoustic wave device according to claim 9, wherein the parameter of $kh_1=2\pi(t_1/\lambda)$ satisfies a relationship of $0.5 \leq kh_1 \leq 0.8$, and the parameter of $kh_2=2\pi(t_2/\lambda)$ satisfies a relationship of $2 \leq kh_2 \leq 3$.

11. A surface acoustic wave device, comprising: at least, diamond, a polycrystalline C-axis-oriented $LiNbO_3$ layer disposed on the diamond, and an interdigital transducer disposed on the $LiNbO_3$ layer; the surface acoustic wave device utilizing surface acoustic wave of 2nd-mode having a wavelength of $\lambda$ (μm), and having a parameter of $kh_1=2\pi(t_1/\lambda)$ satisfying a relationship of $1.4 \leq kh_1 \leq 3$ provided that the thickness of the $LiNbO_3$ layer is $t_1$ (μm).

12. A surface acoustic wave device according to claim 11, wherein the diamond comprises a diamond layer disposed on a base material, the surface acoustic wave device having a parameter of $kh_2=2\pi(t_2/\lambda)$ satisfying a relationship of $4 \leq kh_2$ provided that the thickness of the diamond layer is $t_2$ (μm).

13. A surface acoustic wave device, comprising: at least, diamond, an interdigital transducer disposed on the diamond, a polycrystalline C-axis-oriented $LiNbO_3$ layer disposed on the interdigital transducer, and a short-circuiting electrode disposed on the $LiNbO_3$ layer; the surface acoustic wave device utilizing surface acoustic wave of 1st-mode having a wavelength of $\lambda$ (μm), and having a parameter of $kh_1=2\pi(t_1/\lambda)$ satisfying a relationship of $0.5 \leq kh_1 \leq 1.5$ provided that the thickness of the $LiNbO_3$ layer is $t_1$ (μm).

14. A surface acoustic wave device, comprising: at least, diamond, an interdigital transducer disposed on the diamond, a polycrystalline C-axis-oriented $LiNbO_3$ layer disposed on the interdigital transducer, and a short-circuiting electrode disposed on the $LiNbO_3$ layer; the surface acoustic wave device utilizing surface acoustic wave of 2nd-mode having a wavelength of $\lambda$ (μm), and having a parameter of $kh_1=2\pi(t_1/\lambda)$ satisfying a relationship of $1.5 \leq kh_1 \leq 3$ provided that the thickness of the $LiNbO_3$ layer is $t_1$ (μm).

15. A surface acoustic wave device, comprising: at least, diamond, a short-circuiting electrode disposed on the diamond, a polycrystalline C-axis-oriented $LiNbO_3$ layer disposed on the short-circuiting electrode, and an interdigital transducer disposed on the LiNbO₃ layer; the surface acoustic wave device utilizing surface acoustic wave of 1st-mode having a wavelength of $\lambda$ (μm), and having a parameter of $kh_1=2\pi(t_1/\lambda)$ satisfying a relationship of $0.5 \leq kh_1 \leq 1.5$ provided that the thickness of the LiNbO₃ layer is $t_1$ (μm).

16. A surface acoustic wave device, comprising: at least, diamond, a short-circuiting electrode disposed on the diamond, a polycrystalline C-axis-oriented LiNbO₃ layer disposed on the short-circuiting electrode, and an interdigital transducer disposed on the LiNbO₃ layer; the surface acoustic wave device utilizing surface acoustic wave of 2nd-mode having a wavelength of $\lambda$ (μm), and having a parameter of $kh_1=2\pi(t_1/\lambda)$ satisfying a relationship of $1.5 \leq kh_1 \leq 3$ provided that the thickness of the LiNbO₃ layer is $t_1$ (μm).

17. A surface acoustic wave device according to claim 16, wherein the diamond comprises a diamond layer disposed on a base material, the surface acoustic wave device having a parameter of $kh_2=2\pi(t_2/\lambda)$ satisfying a relationship of $4 \leq kh_2$ provided that the thickness of the diamond layer is $t_2$ (μm).

* * * * *